United States Patent
Boutsidis et al.

(10) Patent No.: US 9,760,537 B2
(45) Date of Patent: Sep. 12, 2017

(54) FINDING A CUR DECOMPOSITION

(71) Applicant: International Business Machines Corporation, Armonk, NY (US)

(72) Inventors: Christos Boutsidis, White Plains, NY (US); David P. Woodruff, Mountain View, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 263 days.

(21) Appl. No.: 14/525,917

(22) Filed: Oct. 28, 2014

(65) Prior Publication Data
US 2016/0117285 A1 Apr. 28, 2016

(51) Int. Cl.
*G06F 17/16* (2006.01)
*H03M 7/30* (2006.01)

(52) U.S. Cl.
CPC .............. *G06F 17/16* (2013.01); *H03M 7/30* (2013.01); *H03M 7/3082* (2013.01)

(58) Field of Classification Search
CPC ...................................................... G06F 17/16
See application file for complete search history.

(56) References Cited

U.S. PATENT DOCUMENTS

| | | |
|---|---|---|
| 7,493,297 B2 | 2/2009 | Achlioptas et al. |
| 8,255,401 B2 | 8/2012 | Clarkson et al. |
| 2013/0226980 A1 | 8/2013 | Grigori et al. |
| 2013/0260697 A1 | 10/2013 | Ephremides et al. |
| 2014/0201185 A1* | 7/2014 | Chang ............... G06F 17/30734 707/709 |
| 2014/0280426 A1* | 9/2014 | Clarkson ................ G06F 17/16 708/520 |

FOREIGN PATENT DOCUMENTS

JP    60238974 A    11/1985

OTHER PUBLICATIONS

Mitrovic et al., CUR Decomposition for Compression and Compressed Sensing of Large-Scale Traffic Data, 2013 IEEE, pp. 1475-1480.*
Drineas et al., "RelativeError CUR Matrix Decompositions," SIAM Journal on Matrix Analysis and Applications 30.2 (Dec. 1, 2008): 40 pages.
Drineas et al.., "Fast Monte Carlo algorithms for matrices III: Computing a compressed approximate matrix decomposition,": SIAM Journal on Computing 36.1 (Dec. 1, 2006): 3 pages.
Mahoney et al., "CUR matrix decompositions for improved data analysis," Proceedings of the National Academy of Sciences of the United States of America, 106.3 (Jan. 20, 2009): 697-702.
Wang et al., "Improving CUR matrix decomposition and the nystrom approximation via adaptive sampling," Journal of Machine Learning Research 14 (Sep. 1, 2013): 43 pages.

* cited by examiner

*Primary Examiner* — Chuong D Ngo
(74) *Attorney, Agent, or Firm* — Cantor Colburn LLP

(57) ABSTRACT

One embodiments is a computer-implemented method for finding a CUR decomposition. The method includes constructing, by a computer processor, a matrix C based on a matrix A. A matrix R is constructed based on the matrix A and the matrix C. A matrix U is constructed based on the matrices A, C, and R. The matrices C, U, and R provide a CUR decomposition of the matrix A. The construction of the matrices C, U, and R provide at least one of an input-sparsity-time CUR and a deterministic CUR.

20 Claims, 5 Drawing Sheets

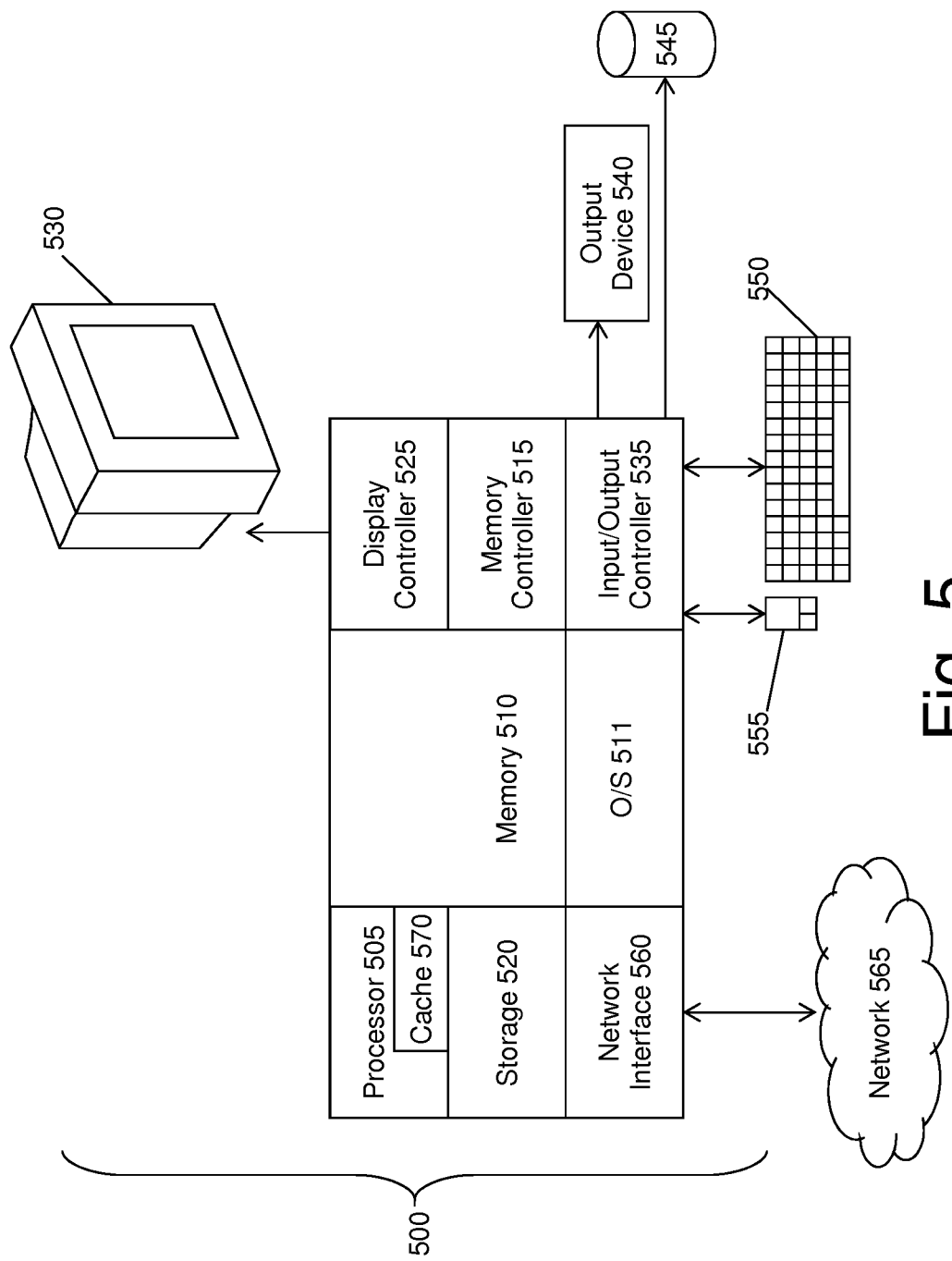

FINDING A CUR DECOMPOSITION

BACKGROUND

Various embodiments of this disclosure relate to CUR decompositions and, more particularly, to improved techniques for finding a CUR decomposition.

CUR decompositions are often applied to the field of data compression. If data is in the form of an m×n matrix A, then storage space of O(mn) is required to store this data. CUR decompositions compress the data by removing some redundancy and reducing the rank of A, hence requiring reduced storage.

Given as inputs a matrix $A \in \mathbb{R}^{m \times n}$ and integers c<n and r<m, the CUR decomposition, or factorization, of A finds $C \in \mathbb{R}^{m \times c}$ with c columns of A, $R \in \mathbb{R}^{r \times n}$ with r rows of A, and $U \in \mathbb{R}^{c \times r}$, such that A=CUR+E. The value of E=A−CUR represents the residual error matrix.

Generally, where matrix A represents some data set, the CUR decomposition of A (i.e., C*U*R) approximates A. For example, a CUR decomposition can be used to compress the data in A by removing some of the redundancy in A. From an algorithmic perspective, it is a challenge to construct C, U, and R quickly and in such a way as to minimize the approximation error $\|A-CUR\|_F^2$.

More precisely, the "CUR Problem," as is will be referred to herein, is as follows: Given $A \in \mathbb{R}^{m \times n}$ of rank ρ=rank(A), rank parameter k<ρ, and accuracy parameter 0<ε<1, construct $C \in \mathbb{R}^{m \times c}$ with c columns from A, $R \in \mathbb{R}^{r \times n}$ with r rows from A, and $U \in \mathbb{R}^{c \times r}$, with c, r, and rank (U) being as small as possible, in order to reconstruct A within relative-error:

$$\|A-CUR\|_F^2 \le (1+\epsilon)\|A-A_k\|_F^2.$$

In contrast to the above is the singular value decomposition (SVD) factorization, where k<rank (A), and $A=U_k \Sigma_k V_k^T + A_{\rho-k}$. The SVD residual error $A_{\rho-k}$ is the best possible, under certain rank constraints. The matrices $U_k \in \mathbb{R}^{m \times k}$ and $V_k \in \mathbb{R}^{n \times k}$ contain the top k left and right singular vectors of A, while $\Sigma_k \in \mathbb{R}^{k \times k}$ contains the top k largest singular values of A. In CUR, C and R contain actual columns and rows of A, a property desirable for feature selection and data interpretation when using CUR as an approximation of A. Because C and R are actual columns and rows of A, sparsity in the input matrix A is also preserved in CUR. Thus, CUR is attractive in a wide range of applications.

SUMMARY

In one embodiment of this disclosure, a computer-implemented method includes constructing, by a computer processor, a matrix C based on a matrix A. A matrix R is constructed based on the matrix A and the matrix C. A matrix U is constructed based on the matrices A, C, and R. The matrices C, U, and R provide a CUR decomposition of the matrix A. The construction of the matrices C, U, and R provide at least one of an input-sparsity-time CUR and a deterministic CUR.

In another embodiment, a system includes a first construction unit, a second construction unit, and a third construction unit. The first construction unit is configured to construct, by a computer processor, a matrix C based on a matrix A. The second construction unit is configured to construct a matrix R based on the matrix A and the matrix C. The third construction unit is configured to construct a matrix U based on the matrices A, C, and R. The matrices C, U, and R provide a CUR decomposition of the matrix A. The construction of the matrices C, U, and R provide at least one of an input -sparsity-time CUR and a deterministic CUR.

In yet another embodiment, a computer program product for finding a CUR decomposition includes a computer readable storage medium having program instructions embodied therewith. The program instructions are executable by a processor to cause the processor to perform a method. The method includes constructing a matrix C based on a matrix A. Further according to the method, a matrix R is constructed based on the matrix A and the matrix C. A matrix U is constructed based on the matrices A, C, and R. The matrices C, U, and R provide a CUR decomposition of the matrix A. The construction of the matrices C, U, and R provide at least one of an input-sparsity-time CUR and a deterministic CUR.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 5 is a block diagram of a computing device for implementing some or all aspects of the decomposition system, according to some embodiments of this disclosure.

DETAILED DESCRIPTION

Figure 1:
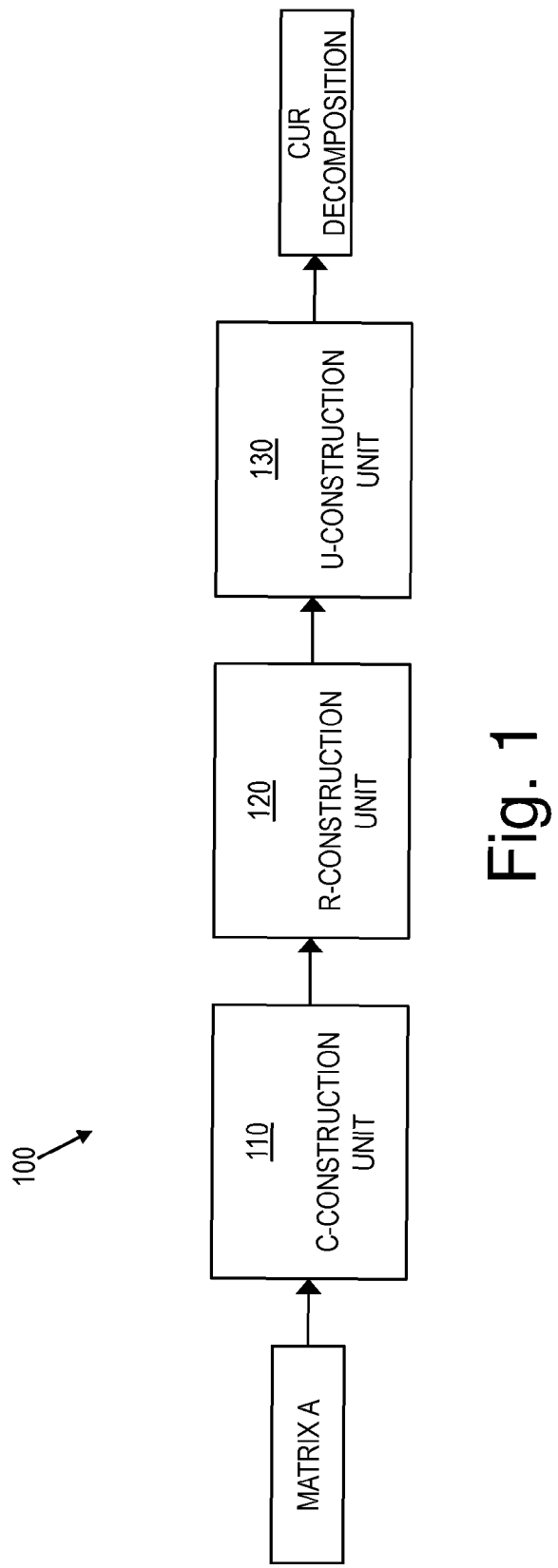
FIG. 1 is a block diagram of a decomposition system, according to some embodiments of this disclosure.

Various embodiments of decomposition systems and methods herein provide improved techniques for finding CUR decompositions. When used for compression, embodiments of the decomposition system may compress the data by removing redundancy and retaining only necessary information, hence requiring reduced less storage. Some embodiments may retain actual data from the input matrix A, which can offer an advantage over existing approaches in terms of interpretability. Further, as compared to CUR techniques used previously, some embodiments may perform faster and may provide a shorter output description than alternatives.

Despite the significant amount of work and progress on CUR, at least the following questions have remained unanswered, given an accuracy parameter 0<ε<1: (1) Optimal CUR: Are there any (1+ε)-error CUR algorithms selecting the optimal number of columns and rows? (2) Rank-k CUR: Are there any (1+ε)-error CUR algorithms constructing A with optimal rank? (3) Input-sparsity-time CUR: Are there any input-sparsity-time (1+ε)-error algorithms for CUR? (4)

Deterministic CUR: Are there any deterministic, polynomial-time $(1+\epsilon)$-error CUR algorithms? The present decomposition systems and methods may address these open problems related to CUR decompositions.

The decomposition system may be based on technical contributions to the art provided in this disclosure, answering the open problems related to optimal CUR, rank-k CUR, input-sparsity-time CUR, and deterministic CUR.

One such technical contribution is an input-sparsity-time, relative-error CUR algorithm selecting an optimal number of columns and rows and constructing a U matrix with optimal rank.

It can be shown that, given $A \in \mathbb{R}^{m \times n}$ of rank $\rho$, a target rank $1 \leq k < \rho$, and $0 < \epsilon < 1$, there exists such a randomized algorithm to select at most $c = O(k/\epsilon)$ columns and at most $r = O(k/\epsilon)$ rows from A, to form matrices $C \in \mathbb{R}^{m \times c}$, $R \in \mathbb{R}^{r \times n}$, and $U \in \mathbb{R}^{c \times r}$ with $rank(U) = k$ such that, with constant probability of success, $$\|A - CUR\|_F^2 \leq (1 + O(\epsilon))\|A - A_k\|_F^2.$$

Further, the matrices C, U, and R can be computed in time $$O(nnz(A) \log n + (m+n) \cdot poly(\log n, k, 1/\epsilon)).$$

Using such an algorithm the present decomposition system may be capable of achieving a relative-error CUR decomposition with $O(k/\epsilon)$ number of rows and columns, which is a task that was not achieved through conventional techniques. This number of rows and columns is asymptotically optimal.

A second technical contribution on which the present decomposition system may be based is a deterministic, relative-error CUR algorithm that runs in time $O(mn^3k/\epsilon)$ (i.e., polynomial time). With this algorithm, the decomposition system may construct C with $c = O(k/\epsilon)$ columns, R with $r = O(k/\epsilon)$ rows, and U of rank k. Existing work provides a relative-error, deterministic algorithm based on volume sampling, constructing C with $O(k/\epsilon)$ columns of A such that $\|A - CC^\dagger A\|_F^2 \leq (1+\epsilon)\|A - A_k\|_F^2$. However, it is not obvious how to extend this to a rank k, column-based, relative-error decomposition, which is a harder instance of the problem. The best existing deterministic algorithm for a rank k, column-based, decomposition achieves only a $(2+\epsilon)$-error.

FIG. 1 is a block diagram of a decomposition system 100, according to some embodiments of this disclosure. As shown, the decomposition system 100 may include a C-construction unit 110, an R-construction unit 120, and a U-construction unit. In general, the C-construction unit 110 may construct matrix C of a CUR decomposition of matrix A; the R-construction 120 unit may construct matrix R of the CUR decomposition; and the U-construction unit 130 may construct matrix U of the CUR decomposition based on C and R. Each of these units 110, 120, 130 may be implemented in hardware, software, or a combination thereof. The construction of each of these matrices will be described further below.

Following is an overview of various techniques used by embodiments of the decomposition system 100. A useful starting point of the present decomposition system 100 is the following tool from prior work, which connects matrix factorizations and column subset selection.

The lemma immediately below has been shown in *Boutsidis* (C. Boutsidis, P. Drineas, and M. Magdon-Ismail; Near optimal column based matrix reconstruction; SIAM Journal on Computing (SICOMP), 2013):

The following is referred to herein as Lemma 1: Let $A = AZZ^T + E \in \mathbb{R}^{m \times n}$ be a low-rank matrix factorization of A, with $Z \in \mathbb{R}^{n \times k}$ and $Z^T Z = I_k$. Let $S \in \mathbb{R}^{n \times c}$ $(c \geq k)$ be any matrix such that $rank(Z^T S) = rank(Z) = k$. Let $C = AS \in \mathbb{R}^{m \times c}$. Then $\|A - CC^\dagger A\|_F^2 \leq \|A - \Pi_{C,k}^F(A)\|_F^2 \leq \|E\|_F^2 + \|ES(Z^T S)^\dagger\|_F^2$. Here, $\Pi_{C,k}^F(A) = CX_{opt} \in \mathbb{R}^{m \times n}$ where $X_{opt} \in \mathbb{R}^{c \times n}$ has rank at most k and $CX_{opt}$ is the best rank-k approximation to A in the column span of C.

If S samples columns from A (i.e., C=AS) consist of original columns of A, then, using the above lemma, one obtains a bound for a column-based, low-rank matrix approximation of A. This bound depends on the specific choice of Z.

Some embodiments of the decompositions system obtain an optimal, relative-error, rank-k CUR by using this lemma twice and adaptively, one time to sample columns from A and the other time to sample rows. This technique is "adaptive" in that the two sampling processes are not independent. Rather, the rows sampled in the second application of the lemma depend on the columns sampled in the first application. An overview of this approach follows.

Assume that for an appropriate matrix $Z_1 \in \mathbb{R}^{n \times k}$, one can find $S_1 \in \mathbb{R}^{n \times c_s}$ that samples $c_1 = O(k)$ columns from A such that after applying Lemma 1 with A and $Z_1$ gives ($C_1 = AS_1$; $E_1 = A - AZ_1 Z_1^T$):

$$\|A - C_1 C_1^\dagger A\|_F^2 \leq \|E_1\|_F^2 + \|E_1 S_1 (Z_1^T S_1)^\dagger\|_F^2 \leq O(1)\|A - AZ_1 Z_1^T\|_F^2 \leq O(1)\|A - A_k\|_F^2.$$

where in the third inequality, it is further assumed that $$\|E_1\|_F^2 = \|A - AZ_1 Z_1^T\|_F^2 \leq O(1)\|A - A_k\|_F^2.$$

In other words, $Z_1$ may approximate, within a constant factor, the best rank-k SVD of A. One choice for $Z_1$ is the matrix $V_k$ from the rank-k SVD of A. However, since this choice is costly, some embodiments herein use methods that approximate the SVD. The bound in the second inequality also requires that the term $\|E_1 S_1 (Z_1^T S_1)^\dagger\|_F^2$ is sufficiently small, specifically $\|E_1 S_1 (Z_1^T S_1)^\dagger\|_F^2 \leq O(1)\|E_1\|_F^2$. This can be achieved by choosing the sampling matrix $S_1$ carefully, which is further discussed below.

Once the matrix $C_1$ with $O(k)$ columns of A is obtained, which approximates the best rank-k matrix within a constant factor, an adaptive sampling method, e.g., the adaptive sampling method of *Deshpande* (A. Deshpande, L. Rademacher, S. Vempala, and G. Wang; Matrix approximation and projective clustering via volume sampling; in Proceedings of the 17th Annual ACM-SIAM Symposium on Discrete Algorithms, pages 1117-1126, 2006), to sample $O(k/\epsilon)$ columns to obtain a matrix C with $c = O(k) + O(k/\epsilon)$ columns for which $$\|A - CC^\dagger A\|_F^2 \leq \|A - CX_{opt}\|_F^2 \leq (1+\epsilon)\|A - A_k\|_F^2.$$

Herein, the above formula is referred to as Equation 1.

The adaptive sampling may convert a constant factor approximation to a relative-error one, by sampling an additional of $O(k/\epsilon)$ columns. Matrix $X_{opt} \in \mathbb{R}^{c \times n}$ has rank at most r. Matrix $CX_{opt}$ is the best rank-k approximation of A in the column span of C, which would be the matrix with columns of A in the CUR decomposition that is sought.

Lemma 1 may be used again to sample rows from A, i.e., by applying the lemma to $A^T$. If matrix C had orthonormal columns, then it could immediately play the role of Z in Lemma 1. In that case, $E = A^T - A^T CC^T$. However, matrix C is not orthonormal. An orthonormal matrix with a similar bound as in Equation 1 is sought. A possible choice is to take Z to be an orthonormal basis of C. However, this choice is not ideal because, in that case, Z would have dimensions $m \times c$. Hence, to satisfy the rank assumption in Lemma 1, one would need to sample at least c rows from $Z \in \mathbb{R}^{m \times c}$. Recall that $c = O(k/\epsilon)$, and therefore $O(k/\epsilon^2)$ rows would need to be sampled in this operation. However, it is desired to obtain a CUR decomposition with only $O(k/\epsilon)$ rows. To achieve that, $O(k/\epsilon)$ rows is too many to select at this point. Rather, some embodiments may select $O(k)$ rows, because otherwise the adaptive sampling operation that follows, which may be unavoidable, would sample $O(k/\epsilon^2)$ rows from A. What is sought is therefore some matrix Z in the column span of C such that $ZZ^TA$ approximates A as well as $CX_{opt}$, and at the same time the number of columns of Z is $O(k)$. To this end, a matrix $Z_2$ is constructed, where $Z_2 \in \mathbb{R}^{m \times k}$ and $Z_2 \in \text{span}(C)$, with $$\|A^T - A^T Z_2 Z_2^T\|_F^2 \leq (1 + O(\epsilon)) \|A - CX_{opt}\|_F^2.$$

Herein, the above is referred to herein as Equation 2.

It is sought to apply Lemma 1 to $A^T$ and $Z_2 \in \mathbb{R}^{m \times k}$. It is assumed that $S_2 \in \mathbb{R}^{m \times r_1}$ (i.e., $R_1 = (A^T S_2)^T \in \mathbb{R}^{r \times n}$) can be found with $r_1 = O(k)$ rows, such that $(E_2^T = A^T - A^T Z_2^T Z_2)$:

$$\|A - AR_1^\dagger R_1\|_F^2 \leq \|E_2\|_F^2 + \|E_2 S_2 (Z_2^T S_2)^\dagger\|_F^2 = \|A - Z_2 Z_2^T A\|_F^2 + \|(A - Z_2 Z_2^T A) S_2 (Z_2^T S_2)^\dagger\|_F^2 \leq O(1) \|A - Z_2 Z_2^T A\|_F^2.$$

Herein, the above is referred to herein as Equation 3.

The last inequality in the above requires that $\|E_2 S_2 (Z_2^T S_2)^\dagger\|_F^2 = O(1) \|E_2\|_F^2$, which is possible after constructing the matrix $S_2$ appropriately.

At this point, a C and a subset of rows R in the optimal CUR have been found. Two additional operations are desired: (1) The adaptive sampling method for CUR that appeared in *Wang* (S. Wang and Z. Zhang; Improving cur matrix decomposition and the nystrom approximation via adaptive sampling; Journal of Machine Learning Research, 2013) may be used to further sample another $r_2 = O(k/\epsilon)$ rows in $R_1$, i.e., construct $R \in \mathbb{R}^{r \times n}$ with $r = O(k + k/\epsilon)$ rows. And (2) for $Z_2 Z_2^T AR^\dagger R$, replace $Z_2$ with $C\Theta$, for an appropriate $\Theta$, and take $U = \Theta Z_2^T AR^\dagger \in \mathbb{R}^{c \times r}$. Such a $\Theta$ always exists because $Z_2$ is in the span of C. So overall, $$CUR = Z_2 Z_2^T AR^\dagger R,$$

and the bound is as follows:

$$\|A - Z_2 Z_2^T AR^\dagger R\|_F^2 \leq \|A - Z_2 Z_2^T A\|_F^2 + \frac{\text{rank}(Z_2 Z_2^T A)}{r_2} \|A - AR_1^\dagger R_1\|_F^2 =$$

$$\|A - Z_2 Z_2^T A\|_F^2 + O(\varepsilon) \|A - A_1^\dagger R_1\|_F^2 \leq (1 + O(\varepsilon)) \|A - Z_2 Z_2^T A\|_F^2 \leq$$

$$(1 + O(\varepsilon)) \|A - CX_{opt}\|_F^2 \leq (1 + O(\varepsilon)) \|A - A_k\|_F^2$$

The first inequality in the group directly above is from the adaptive sampling argument. The equality is from a selected choice of $r_2$. The second inequality is from Equation 3. The third inequality is from Equation 2. The last inequality is from Equation 1.

From all the above derivations, four sufficient conditions that give an optimal, relative-error, rank-k CUR may be identified. These conditions are referred to herein as primitives. By designing matrices C, U, and R satisfying those basic primitives, an optimal, relative-error, rank-k CUR may be secured, according to some embodiments.

To construct an optimal, relative-error, and rank-k CUR, the four basic primitives that may be relied upon are: (1) There is a $C \in \mathbb{R}^{m \times c}$, $X_{opt} \in \mathbb{R}^{c \times n}$ with a relative-error bound to $A - A_k$ and $c = O(k/\epsilon)$, as provided in Equation 1. (2) There is a $Z_2 \in \mathbb{R}^{m \times k}$ ($Z_2 \in \text{span}(C)$ and $Z_2^T Z_2 = I_k$) with a relative-error bound to $A - CX_{opt}$, as provided in Equation 2. (3) There is $R_1 \in \mathbb{R}^{r_2 \times n}$ with a constant factor error to $A - Z_2 Z_2^T A$ and $r_1 = O(k)$, as provided in Equation 3. And (4) there is an adaptive sampling algorithm for CUR.

In some embodiments, a user or administrator of the decomposition system 100 may be enabled to select C, $Z_2$, and $R_1$ in the above conditions as desired. Below, various implementation choices that lead to desirable CUR algorithms are further discussed.

To address Primitive 1 above, known ideas for column subset selection, including leverage-scores sampling as in *Drineas* (P. Drineas, M. W. Mahoney, and S. Muthukrishnan; Relative-error cur matrix decompositions; SIAM Journal Matrix Analysis and Applications, 30(2):844-881, 2008); BSS sampling, i.e., deterministic sampling similar to the method of *Batson* (J. Batson, D. Spielman, and N. Srivastava. Twice-ramanujan sparsifiers; In Proceedings of the 41st annual ACM symposium on Theory of computing, pages 255-262; ACM, 2009); and adaptive sampling, as in *Deshpande*, may be combined. To find techniques for approximating the SVD may be used. To address Primitive 2, methods to find low-rank approximations within a subspace may be used. To address Primitive 3, leverage-score sampling and BSS sampling may again be used, as in Primitive 1. To address Primitive 4, an adaptive sampling method, such as that of *Wang*, may be used to turn a constant factor CUR to relative error by sampling an additional $O(k/\epsilon)$ rows. These various operations are summarized in Algorithm 1, which is referred to herein as a "proto-algorithm" for an optimal, relative -error, rank-k CUR.

Algorithm 1 is a proto-algorithm for an optimal, relative-error, rank-k CUR. Algorithm 1 may be implemented on a computer system in hardware, software, or a combination thereof. Various operations performed in this algorithm follow immediately below:

Input: $A \in \mathbb{R}^{m \times n}$; rank parameter k<rank(A); accuracy parameter $0 < \epsilon < 1$.

Output: $C \in \mathbb{R}^{m \times c}$ with $c = O(k/\epsilon)$; $R \in \mathbb{R}^{r \times n}$ with $r = O(k/\epsilon)$; $U \in \mathbb{R}^{c \times r}$ with rank(U)=k.

(1) Construct C with $O(k + k/\epsilon)$ columns. This includes the operations of (1a) -(1d).

(1a) Approximate SVD: find $Z_1 \in \mathbb{R}^{n \times O(k)}$ that approximates $V_k \in \mathbb{R}^{n \times k}$ from the SVD of A.

(1b) Leverage-scores sampling: Sample $O(k \log k)$ columns from A with probabilities from $Z_1$.

(1c) BSS sampling: downsample these columns to $O(k)$ columns.

(1d) Adaptive sampling: sample $O(k/\epsilon)$ additional columns.

(2) Construct R with $O(k + k/\epsilon)$ rows. This includes the operations of (2a) -(2d).

(2a) Restricted low-rank approximation: find $Z_2 \in \mathbb{R}^{m \times O(k)}$ with $Z_2 \in \text{span}(C)$.

(2b) Leverage-scores sampling: sample $O(k \log k)$ rows from A with probabilities from $Z_2$.

(2c) BSS sampling: downsample these rows to $O(k)$ rows.

(2d) Adaptive sampling: sample $O(k/\epsilon)$ additional rows.

(3) Construct U of rank k. This includes the operations of (3a).

(3a) Let $Z_2 Z_2^T AR^\dagger R$; then, replace $Z2 = C\Theta$; for an appropriate $\Theta$; and use $U = \Theta Z_2^T AR^\dagger$.

Figure 2:
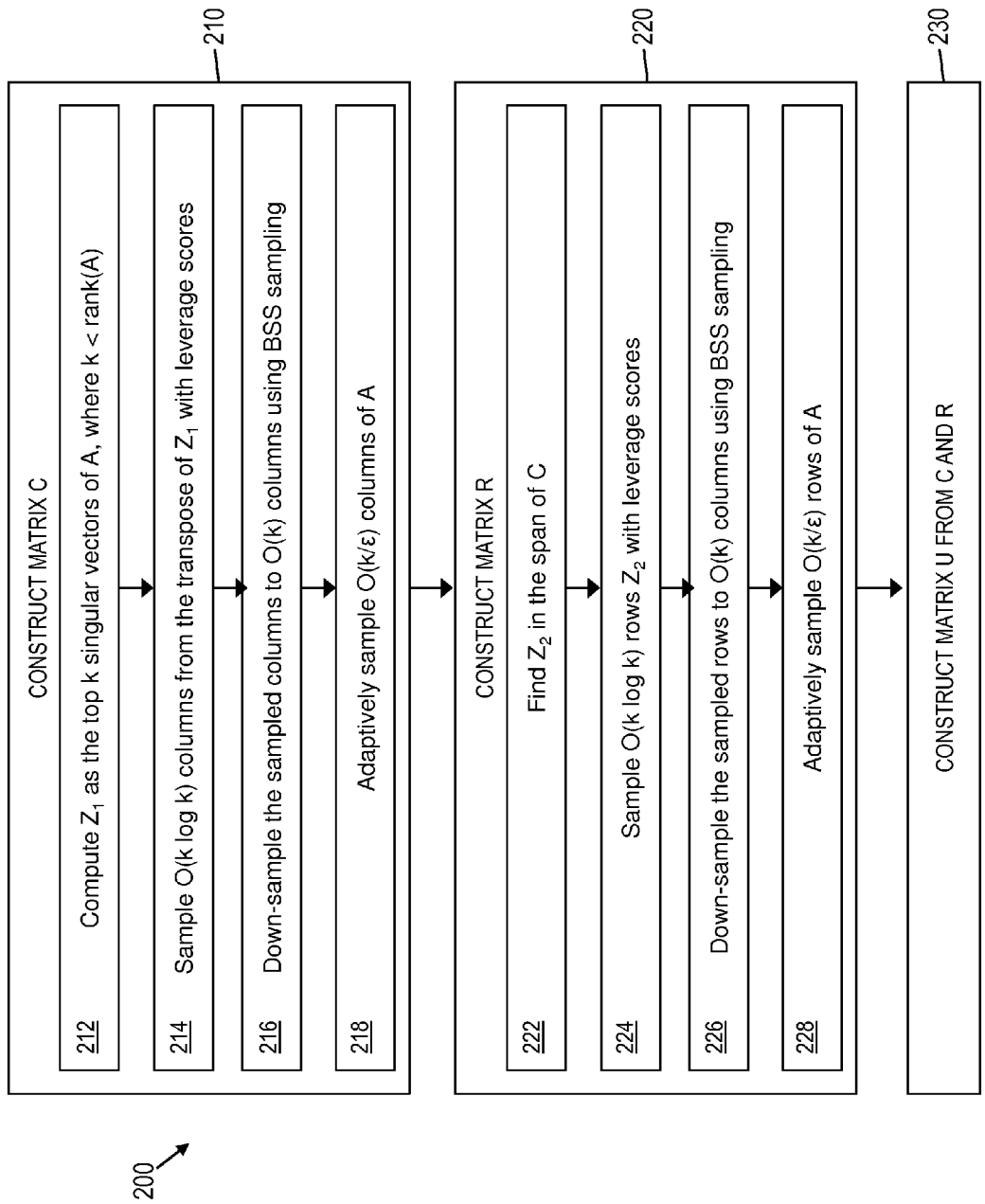
FIG. 2 is a flow diagram of a method for finding a CUR decomposition of a matrix A, according to some embodiments of this disclosure.

FIG. 2 is a flow diagram of a method 200 for finding a CUR decomposition of a matrix A, using Algorithm 1, according to some embodiments of this disclosure. At a high level, matrix C may be constructed with $O(k/\epsilon)$ columns at block 210, matrix R may be constructed with $O(k/\epsilon)$ rows at block 220, and matrix U may be constructed from matrices C and R at block 230.

More specifically, block 210 for constructing C may include blocks 212, 214, 216, and 218. At block 212, $Z_1$ may be computed as the top k singular vectors of A, such that $\|A-AZ_1Z_1^T\|_F^2 \leq (1+\epsilon)\|A-A_k\|_F^2$. At block 214, O(k log k) columns may be sampled from the transpose of $Z_1$ or, equivalently, from A, with leverage scores, i.e., Euclidean norms of the columns of $Z_1$ transpose. At block 216, the sampled columns may be down-sampled to $C_1 \in \mathbb{R}^{m \times c_2}$ containing $c_1=O(k)$ columns, such as by using BSS sampling, and such that $\|A-C_1C_1^\dagger\|_F^2 \leq O(1)\|A-AZ_1Z_1^T\|_F^2$. At block 218, $c_2=O(k/\epsilon)$ columns of A may be adaptively sampled, such that $\|A-C \cdot D\|_F^2 \leq \|A-A_k\|_F^2 + (k/c_2)\|A-C_1C_1^\dagger A\|_F^2$, where D is a rank-k matrix.

Block 220 for constructing R may include block 222, 224, 226, and 228. At block 222, $Z_2 \in \mathbb{R}^{m \times k}$ may be found in the span of C, such that $\|A-AZ_2Z_2^T\|_F^2 \leq (1+\epsilon)\|A-A_k\|_F^2$. To do this efficiently, instead of projecting columns of A onto C, the decomposition system 100 may project columns of AW onto C, where W is a random subspace embedding. The decomposition system 100 may then find a best rank-k approximate of the columns of AW in C. At block 224, O(k log k) rows with leverage scores may be sampled from $Z_2$. At block 226, those sampled rows may be down-sampled to $R_1 \in \mathbb{R}^{r_2 \times n}$ containing $r_1=O(k)$ rows, such as by BSS sampling, and such that $\|A-R_1R_1^\dagger\|_F^2 \leq O(1)\|A-AZ_2Z_2^T A\|_F^2$. At block 228, $r_2=O(k/\epsilon)$ rows of A may be adaptively sampled, such that $$\|A - Z_2Z_2^T AR^\dagger R\|_F^2 \leq \|A - Z_2Z_2^T A\|_F^2 + \mathrm{rank}\left(\frac{Z_2Z_2^T A}{r_2}\right)\|A - AR_1R_1^\dagger\|_F^2.$$

To obtain a deterministic or input-sparsity-time CUR, the decomposition system 100 may implement the corresponding operations of the proto-algorithm, as provided above, in an appropriate setting. This is further discussed below.

For an algorithm that runs in time proportional to the number of non-zero entries of A, one may to implement the four primitives in input-sparsity time. Equivalently, all the operations of the proto-algorithm may be implemented in input-sparsity time. It is known how to implement approximate SVD in input-sparsity time. Given the relevant probabilities, the leverage-scores sampling operation can be implemented fast as well. For the remainder of the operations of the proto-algorithm, new tools are needed and used by various embodiments.

An input-sparsity-time version of the BSS sampling operation may be used. To design this, as will be described further below, one combines the method from Boutsidis with ideas from the sparse subspace embedding literature of Clarkson (K. L. Clarkson and D. P. Woodruff; Low rank approximation and regression in input sparsity time; In STOC, 2013). Various embodiments also use input-sparsity-time versions of the adaptive sampling algorithms of Deshpande and Wang. To this end, one combines existing ideas in Deshpande and Wang with the Johnson-Lindenstrauss lemma. An input-sparsity-time algorithm to find a relative-error, low-rank matrix within a given subspace may also be used. To this end, one combines ideas for subspace-restricted matrix approximations with ideas from Kannan (R. Kannan, S. Vempala, and D. P. Woodruff; Nimble algorithms for cloud computing; arXiv preprint arXiv:1304.3162, v3, 2013) and Clarkson. A method, presented below, may be used to compute a rank-k matrix U in input-sparsity time. To determine this method, one may take the original construction of U, which is a series of products of various matrices, and reduce the dimensions of some of those matrices using the sparse subspace embeddings in Clarkson. The computation of U may be viewed as the solution of a generalized matrix approximation problem, to which sketching concepts may be applied.

For a deterministic CUR algorithm, the CUR proto-algorithm may be implemented in a deterministic way. Various operations may be implemented deterministically with tools from conventional techniques. A missing piece from the existing art is a deterministic version of adaptive sampling, which is obtained in this disclosure by derandomizing the adaptive sampling algorithms in Deshpande and Wang.

Some embodiments of the decomposition system 100 of this disclosure implement a randomized CUR algorithm that runs in linear time. In some embodiments, the algorithm constructs C and R with rescaled columns and rows from A. To convert this to a truly CUR decomposition, the decomposition system 100 may keep the un-rescaled versions of C and R, and introduce the scaling factors in U. The analysis carries over to that CUR version unchanged. The embodiment below need not provide the fastest possible CUR algorithm, but does provide a benefit in its simplicity. A faster randomized algorithm is presented following this one. The analysis of the algorithm in this section serves as a stepping stone for the input-sparsity-time and deterministic CUR algorithms presented later.

Algorithm 2 is a randomized, linear-time, optimal, relative-error, rank-k CUR, that closely follows the CUR proto-algorithm (i.e., Algorithm 1). Algorithm 2 may be implemented on a computer system in hardware, software, or a combination thereof. Various operations performed in this algorithm follow immediately below:

Input: $A \in \mathbb{R}^{m \times n}$; rank parameter k<rank (A); and accuracy parameter $0 < \epsilon < 1$.

Output: $C \in \mathbb{R}^{m \times c}$ with $c=O(k/\epsilon)$; $R \in \mathbb{R}^{r \times n}$ with $r=O(k/\epsilon)$; and $U \in \mathbb{R}^{c \times r}$ with rank (U)=k.

(1) Construct C with $O(k+k/\epsilon)$ columns. This includes the operations of (1a)-(1d).

(1a) $Z_1$=RandomizedSVD(A, k, 1); $Z_1 \in \mathbb{R}^{n \times k} (Z_1^T Z_1 = I_k)$; $E_1 = A - AZ_1Z_1^T \in \mathbb{R}^{m \times n}$.

(1b) $[\Omega_1, D_1]$=RandSampling($Z_1$, $h_1$, 1); $h_1$=16kln(20k); $\Omega_1 \in \mathbb{R}^{n \times h_2}$; $D_1 \in \mathbb{R}^{h_2 \times h_2}$.

$M_1 = Z_1^T \Omega_1 D_1 \in \mathbb{R}^{k \times h_1}$. $M_1 = U_{M_2} \Sigma_{M_2} V_{M_2}^T$ with rank($M_1$)=k and $V_{M_1} \in \mathbb{R}^{h_1 \times k}$.

(1c) $S_1$=BssSampling($V_{M_1}$, $(E_1 \Omega_1 D_1)^T$, $c_1$), with $c_1$=4k, $S_1 \in \mathbb{R}^{h_1 \times c_s}$.

$C_1 = A\Omega_1 D_1 S_1 \in \mathbb{R}^{m \times c_2}$ containing rescaled columns of A.

(1d) $C_2$=AdaptiveCols(A, $C_1$, 1, $c_2$), with $$c_2 = \frac{1620k}{s}$$

and $C_2 \in \mathbb{R}^{m \times c_2}$ with columns of A.

$C=[C_1 C_2] \in \mathbb{R}^{m \times c}$ containing $$c = c_1 + c_2 = 4k + \frac{1620k}{s}$$

rescaled columns of A.

(2) Construct R with $O(k+l/\epsilon)$ rows. This includes the operations of (2a)-(2d).

(2a) [Y,Ψ, Δ]=BestSubspaceSVD(A,C,k); $Y \in \mathbb{R}^{m \times c}$, $\Psi \in \mathbb{R}^{c \times c}$, $\Delta \in \mathbb{R}^{c \times k}$; $B=Y\Delta$.

$B=Z_2D$ is a qr-factorization of B with $Z_2 \in \mathbb{R}^{m \times k}$ ($Z_2^T Z_2 = I_k$), $D \in \mathbb{R}^{k \times k}$, and $E_2 = A^T - A^T Z_2 Z_2^T$.

(2b) $[\Omega_2, D_2]$=RandSampling($Z_2,h_2,1$); $h_2$=8kln(20k); $\Omega_2 \in \mathbb{R}^{m \times h_2}$; $D_2 \in \mathbb{R}^{h_2 \times h_2}$.

$M_2 = Z_2^T \Omega_2 D_2 \in \mathbb{R}^{k \times h_2}$. $M_2 = U_{M_2} \Sigma_{M_2} V_{M_2}^T$ with rank($M_2$)=k and $V_{M_2} \in \mathbb{R}^{h_2 \times k}$.

(2c) $S_2$=BssSampling($V_{M_2}$, $(E_2 \Omega_2 D_2)^T$, $r_1$), with $r_1$=4k and $S_2 \in \mathbb{R}^{h_2 \times 2_1}$.

$R_1 = (A^T \Omega_2 D_2 S_2)^T \in \mathbb{R}^{r_s \times n}$ containing rescaled rows from A.

(2d) $R_2$=AdaptiveRows(A, $Z_2$, $R_1$, $r_2$), with $$r_2 = \left\lceil \frac{1620k}{s} \right\rceil \text{ and } R_2 \in \mathbb{R}^{r_2 \times n}$$

with rows of A.

$R = [R_1^T, R_2^T]^T \in \mathbb{R}^{(r_2+r_2) \times n}$ containing $$r = 4k + \frac{1620k}{s}$$

rescaled rows of A.

(3) Construct U of rank k. This includes the operations of (3a).

(3a) Construct $U \in \mathbb{R}^{c \times r}$ with rank at most k as follows, with these equivalent formulas:

$$U = \Psi^{-1} \Delta D^{-1} Z_2^T A R^\dagger = \Psi^{-1} \Delta D^{-1} (C \Psi^{-1} \Delta D^{-1})^T A R^\dagger$$
$$= \Psi^{-1} \Delta D^{-1} (C \Psi^{-1} \Delta D^{-1})^\dagger A R^\dagger$$
$$= \Psi^{-1} \Delta D^{-1} D \Delta^T \Psi C^\dagger A R^\dagger$$
$$= \Psi^{-1} \Delta \Delta^T \Psi C^\dagger A R^\dagger$$

Algorithm 2 takes as input an m×n matrix A, rank parameter k<rank(A), and accuracy parameter 0<ε<1. These are the same inputs as in the CUR Problem. The algorithm may output matrix $C \in \mathbb{R}^{m \times c}$ with c=O(k/ε) columns of A, matrix $R \in \mathbb{R}^{r \times n}$ with r=O(k/ε) rows of A, and matrix $U \in \mathbb{R}^{c \times r}$ with rank at most k. Algorithm 2 may closely follow the CUR proto-algorithm that is Algorithm 1. However, Algorithm 2 may make specific choices for the various operations of the proto-algorithm that can be implemented in linear time. Algorithm 2 may have three operations: (1) an optimal number of columns are selected in C; (2) an optimal number of rows are selected in R; and (3) an intersection matrix with optimal rank is constructed as U. The algorithm itself refers to several other algorithms, combined in a novel manner. Specifically, the algorithm refers to RandomizedSVD, which is described in Lemma 3.4 of Boutsidis; RandSampling, which is described in Rudelson (M. Rudelson and R. Vershynin; Sampling from large matrices: An approach through geometric functional analysis; JACM: Journal of the ACM, 54, 2007); BssSampling, which is described in Lemma 3.6 of Boutsidis; AdaptiveCols, which is described in Lemma 2.1 of Deshpande II (A. Deshpande, L. Rademacher, S. Vempala, and G.Wang; Matrix approximation and projective clustering via volume sampling; In Proceedings of the 17th Annual ACM -SIAM Symposium on Discrete Algorithms, pages 1117-1126, 2006); BestSubspaceSVD, which is described in Clarkson II (K. Clarkson and D. Woodruff; Numerical linear algebra in the streaming mode;. In Proceedings of the 41st annual ACM symposium on Theory of computing (STOC), 2009); and AdaptiveRows, which is described in Theorem 4 of Wang.

It can be shown that the total asymptotic running time of the above algorithm is as follows:

$$O\left(n^2 k/\varepsilon + m^2 k/\varepsilon + mk^2/\varepsilon^2 + k^3/\varepsilon^3 + k^4 \ln k + \frac{k}{\varepsilon} \log \frac{k}{\varepsilon}\right).$$

With respect to an error bound, it can additionally be shown that the matrices C, U, and R in Algorithm 2 satisfy the following with probability at least 0.2:

$$\|A - CUR\|_F^2 \leq (1+20\varepsilon) \|A - A_k\|_F^2.$$

Following, a CUR algorithm that runs in input-sparsity time is presented and analyzed. More specifically, this algorithm constructs C and R with rescaled columns and rows from A. To convert this to a truly CUR decomposition, the decomposition system 100 may keep the un-rescaled versions of C and R and introduce the scaling factors in U. The analysis carries over to that CUR version unchanged.

The algorithm description below closely follows the CUR proto-algorithm in Algorithm 1. Algorithm 3 may be implemented on a computer system in hardware, software, or a combination thereof. Various operations performed in this algorithm follow immediately below:

Input: $A \in \mathbb{R}^{m \times n}$; rank parameter k<rank (A); and accuracy parameter 0<ε<1.

Output: $C \in \mathbb{R}^{m \times c}$ with c=O(k/ε); $R \in \mathbb{R}^{r \times n}$ with r=O(k/ε); $U \in \mathbb{R}^{c \times r}$ with rank(U)=k.

Construct C with O(k+k/ε) columns. This includes the operations of (1a) -(1d).

(1a) $Z_1$=SparseSVD(A, k, 1); $Z_1 \in \mathbb{R}^{n \times k} (Z_1^T Z_1 = I_k)$.

(1b) $[\Omega_1, D_1]$=RandSampling($Z_1, h_1, 1$); $h_1$=16kln(20k); $\Omega_1 \in \mathbb{R}^{n \times h_2}$; $D_1 \in \mathbb{R}^{h_1 \times h_1}$.

$M_1 = Z_1^T \Omega_1 D_1 \in \mathbb{R}^{k \times h_1}$. $M_1 = U_{M_2} \Sigma_{M_2} V_{M_2}^T$ with rank($M_1$)=k and $V_{M_2} \in \mathbb{R}^{h_2 \times k}$.

(1c) $S_1$=BssSamplingSparse($V_{M_1}$, $((A - A Z_1 Z_1^T) \Omega_1 D_1)^T$, $c_1$, 0.5), with $c_1$=4k, $S_1 \in \mathbb{R}^{h_1 \times 1_1}$.

$C_1 = A \Omega_1 D_1 S_1 \in \mathbb{R}^{m \times c_2}$ containing rescaled columns of A.

(1d) $C_2$=AdaptiveColsSparse(A, $C_1$, 1, $c_2$);

$$c_2 = \frac{4820k}{s}; C_2 \in \mathbb{R}^{m \times c_2}$$

with columns of A.

$C = [C_1 C_2] \in \mathbb{R}^{m \times c}$ containing $$c = c_1 + c_2 = 4k + \frac{4820k}{s}$$

rescaled columns of A.

(2) Construct R with O(k+l/ε) rows. This includes the operations of (2a) -(2d).

(2a) $[Y, \Psi, \Delta]$=ApproxSubspaceSVD(A,C,k); $Y \in \mathbb{R}^{m \times c}$, $\Psi \in \mathbb{R}^{c \times c}$, $\Delta \in \mathbb{R}^{c \times k}$; $B = Y\Delta$.

$B = Z_2 D$ is a qr decomposition of B with $Z_2 \in \mathbb{R}^{m \times k}$ ($Z_2^T Z_2 = I_k$), $D \in \mathbb{R}^{k \times k}$.

(2b) $[\Omega_2, D_2]$=RandSampling($Z_2, h_2, 1$); $h_2$=8kln(20k); $\Omega_2 \in \mathbb{R}^{m \times h_2}$; $D_2 \in \mathbb{R}^{h_2 \times h_2}$.

$M_2 = Z_2^T \Omega_2 D_2 \in \mathbb{R}^{k \times h_2}$. $M_2 = U_{M_2} \Sigma_{M_2} V_{M_2}^T$ with rank($M_2$)=k and $V_{M_2} \in \mathbb{R}^{h_2 \times k}$.

(2c) $S_2$=BssSamplingSparse($V_{M_2}$, $((A^T - A^T Z_2 Z_2^T) \Omega_2 D_2)^T$, $r_1$, 0.5), with $r_1$=4k, $S_2 \in \mathbb{R}^{h_2 \times r_2^2}$.

$R_1=(A^T\Omega_2 D_2 S_2)^T \in \mathbb{R}^{r_2 \times n}$ containing rescaled rows from A.

(2d) $R_2$=AdaptiveRowsSparse(A, $Z_2$, $R_1$, $r_2$);

$$r_2 = \frac{4820k}{s}; R_2 \in \mathbb{R}^{r_2 \times m}$$

with rows of A.

$R=[R_1^T, R_2^T]^T \in \mathbb{R}^{(r_2+r_2) \times n}$ containing $$r = 4k + \frac{4820k}{s}$$

rescaled rows of A.

(3) Construct U of rank k. This includes the operations of (3a).

(3a) Let $W \in \mathbb{R}^{\zeta \times m}$ be a randomly chosen sparse subspace embedding with $\zeta=\Omega(k^2 \epsilon^{-2})$. Then $$U=\Psi^{-1}\Delta D^{-1}(WC\Psi^{-1}\Delta D^{-1})^{554} WAR^\dagger=\Psi^{-1}\Delta\Delta^T(WC)^\dagger WAR^\dagger.$$

Algorithm 3 takes as input an m×n matrix A, rank parameter k<rank(A), and accuracy parameter 0<ϵ<1. These are the same inputs as in the CUR Problem. The algorithm may return matrix $C \in \mathbb{R}^{m \times c}$ with c=O(k/ϵ) columns of A, matrix $R \in \mathbb{R}^{r \times n}$ with r=O(k/ϵ) rows of A, and matrix $U \in \mathbb{R}^{c \times r}$ with rank at most k. Although Algorithm 3 follows closely the CUR proto-algorithm in Algorithm 1, this algorithm may make specific choices for the various actions of the proto-algorithm that can be implemented in input-sparsity time.

In some embodiments, Algorithm 3 may run as follows: (1) An optimal number of columns are selected in C. (2) An optimal number of rows are selected in R. And (3) an intersection matrix with optimal rank is constructed and denoted as U. As provided above, the algorithm itself refers to several other algorithms, including new algorithms as well as existing ones combined in a novel manner. Specifically, the algorithm refers to SparseSVD, which is described in Theorem 47 of Clarkson III (K. L. Clarkson and D. P. Woodruff; Low rank approximation and regression in input sparsity time; 2013); RandSampling, which is described in Rudelson; BssSampling, which is described in Lemma 3.6 of Boutsidis; AdaptiveColsSparse, which is described in Lemma 3 herein; ApproxSubspaceSVD, which is described in Kannan (R. Kannan, S. Vempala, and D. P. Woodruff; Nimble algorithms for cloud computing. arXiv preprint arXiv:1304.3162, v3, 2013); and AdaptiveRowsSparse, which is described in Lemma 4 herein.

Figure 3:
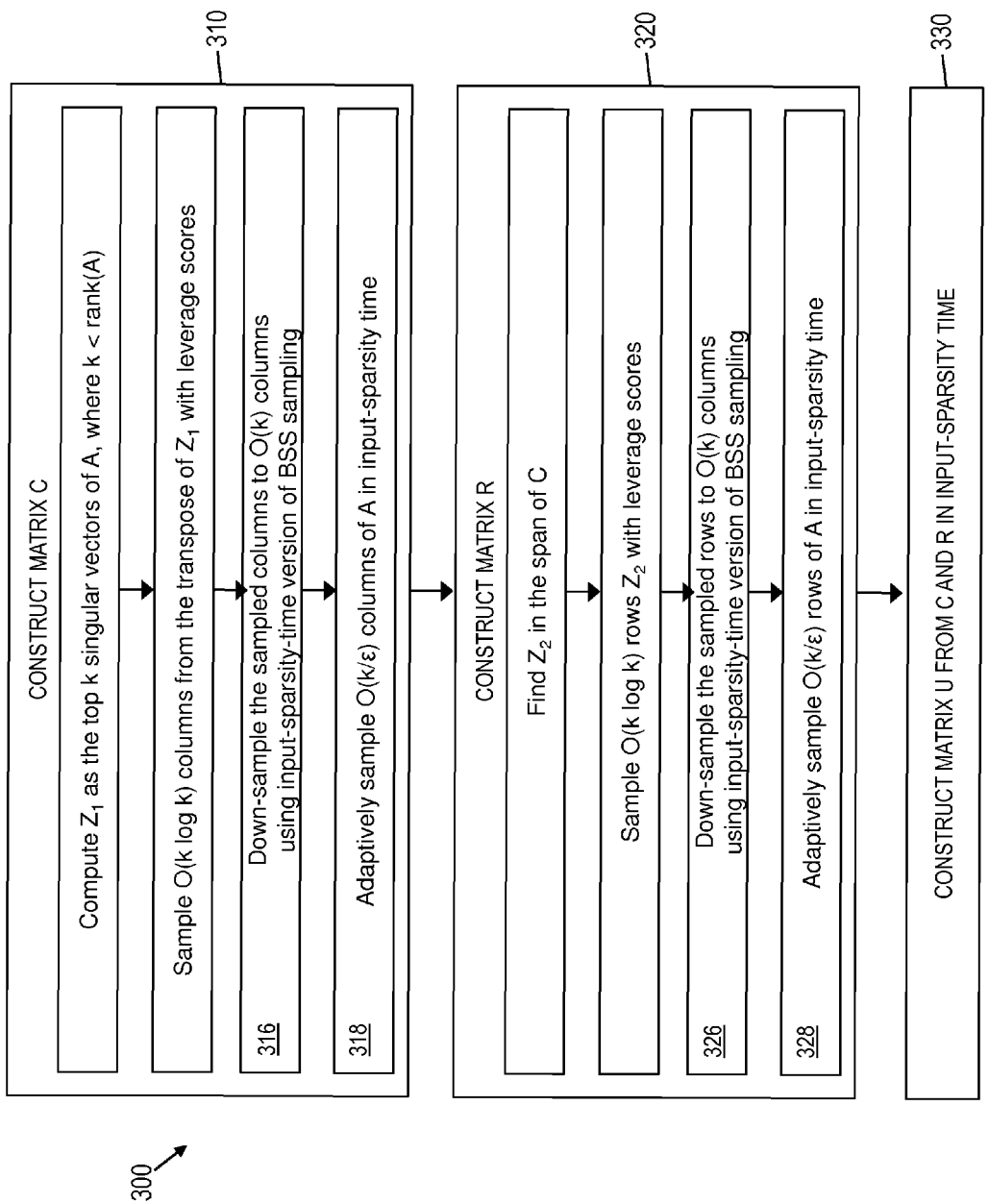
FIG. 3 is a flow diagram of a method for finding a CUR decomposition of a matrix A in input-sparsity time, according to some embodiments of this disclosure.

FIG. 3 is a flow diagram of a method 300 for finding a CUR decomposition of a matrix A in input-sparsity time, using Algorithm 3, according to some embodiments of this disclosure. At a high level, matrix C may be constructed with O(k/ϵ) columns at block 310, matrix R may be constructed with O(k/ϵ) rows at block 320, and matrix U may be constructed from matrices C and R at block 330. The decomposition method 300 of FIG. 3 is similar to the decomposition method 200 of FIG. 2, with some exceptions. As a first exception, at blocks 316 and 326, an input-sparsity-time version of the BSS sampling technique may be used, as will be described further below. As a second exception, at blocks 318 and 328, the adaptive sampling performed may be an input-sparsity-time version, as will be described further below. Additionally, the constructions of U at block 330 may run in input-sparsity time.

It can be shown that the total running time of the above algorithm is as follows:

$$O(nnz(A) \log n+(m+n) \cdot poly(\log n, k, 1/\epsilon)).$$

With respect to a quality-of-approximation result (i e , error bounds) of Algorithm 3, it can also be shown that the matrices C, U, and R in Algorithm 3 satisfy, with probability at least 0.16−2/n, $$\|A-CUR\|_F^2 \leq (1+\epsilon)(1+60\epsilon)\|A-A_k\|_F^2.$$

The above Algorithm 3 for an input-sparsity-time CUR decomposition may include other algorithms, some of which exist in the art and some of which are newly provided in this disclosure. Below, those that are new are described in detail.

For use in this algorithm, an input-sparsity-time version of the so-called "BSS sampling" algorithm of Batson may be developed, as an extension of the original BSS algorithm that appeared in Boutsidis.

The following is referred to herein as Lemma 2, an input-sparsity-time, dual- set, spectral-frobenius sparsification: Let $V=(v_1, \ldots, v_n)$ be a decomposition of the identity, where $v_i \in \mathbb{R}^k$ (k<n) and $\Sigma_{i=1}^n v_i v_i^T = I_k$. Let $A=(a_1, \ldots, a_n)$ be an arbitrary set of vectors, where $\alpha_i \in \mathbb{R}^l$. Let $W \in \mathbb{R}^{\zeta \times l}$ be a randomly chosen sparse subspace embedding with $\zeta=O(n^2/\epsilon^2)<1$, for some 0<ϵ<1 Consider a new set of vectors $B=(W\alpha_1, \ldots, W\alpha_n)$, with $W\alpha_i \in \mathbb{R}^\zeta$. Run the algorithm of Lemma 3.6 of Boutsidis, with $v=(v_1, \ldots, v_n)$, $B=(W\alpha_1, \ldots, W\alpha_n)$, and some integer r such that k<r≤n. Let the output of this be a set of weights $s_i \geq 0 (l=1 \ldots n)$, at most r of which are non-zero Then, with probability at least 0.98, $$\lambda_k\left(\sum_{i=1}^n s_i v_i v_i^T\right) \geq \left(1-\sqrt{\frac{k}{r}}\right)^2,$$

$$Tr\left(\sum_{i=1}^n s_i a_i a_i^T\right) \leq \frac{1+\epsilon}{1-\epsilon} \cdot Tr\left(\sum_{i=1}^n a_i a_i^T\right)$$

$$= \frac{1+\epsilon}{1-\epsilon} \cdot \sum_{i=1}^n \|a_i\|_2^2.$$

Equivalently, if $V \in \mathbb{R}^{n \times k}$ is a matrix whose rows are the vectors $v_i^T$, $A \in \mathbb{R}^{n \times l}$ is a matrix whose rows are the vectors $\alpha_i^T$, $B=AW^T \in \mathbb{R}^{n \times \zeta}$ is a matrix whose rows are the vectors $\alpha_i^T W^T$, and $S \in \mathbb{R}^{n \times r}$ is the sampling matrix containing the weights $s_i > 0$, then with probability at least 0.98, $$\sigma_k(V^T S) \geq 1-\sqrt{\frac{k}{r}}, \quad \|A^T S\|_F^2 \leq \frac{1+\epsilon}{1-\epsilon}\|A\|_F^2.$$

The weights $s_i$ can be computed in $O(nnz(A)+rnk^2+n\zeta)$ time. The procedure is denoted herein as S=BssSamplingSparse(V , A, r ϵ).

Lemma 2 may be proven as follows: The algorithm constructs S as S=BssSampling(V , B, r). The lower bound for the smallest singular value of V is immediate from Lemma 3.6 of Boutsidis . That lemma also ensures that $$\|B^T S\|_F^2 \leq \|B^T\|_F^2.$$

i.e., $$\|WA^T S\|_F^2 \leq \|WA^T\|_F^2.$$

Since is a subspace embedding, from Clarkson III, it is the case that, with probability at least 0.99, and for all vectors $y \in \mathbb{R}^n$ simultaneously, $$(1-\epsilon)\|A^T y\|_2^2 \leq \|WA^T y\|_2^2.$$

Apply this r times for $y \in \mathbb{R}^n$ being columns from $S \in \mathbb{R}^{m \times r}$, and take a sum on the resulting inequalities, $$(1-\epsilon)\|A^T S\|_F^2 \leq \|WA^T S\|_F^2.$$

From Lemma 40 of Clarkson III, it is the case that, with probability at least 0.99, $$\|WA^T\|_F^2 \leq (1+\epsilon)\|A^T\|_F^2.$$

Combining these inequalities together, it can be concluded that, with probability at least 0.98, $$\|A^T S\|_F^2 \leq \frac{1+\epsilon}{1-\epsilon} \|A^T\|_F^2.$$

Following are developed input-sparsity-time versions of certain adaptive sampling algorithms. The lemma below corresponds to a fast version of the adaptive sampling algorithm of Theorem 2.1 of Deshpande II.

The following is referred to herein as Lemma 3: Given $A \in \mathbb{R}^{m \times n}$ and $V \in \mathbb{R}^{m \times c_s}$ (with $c_1 \leq n$, m), there exists a randomized algorithm to construct $C_2 \in \mathbb{R}^{m \times c_2}$ containing $c_2$ columns of A, such that the matrix $C = [V \ C_2] \in \mathbb{R}^{m \times (c_1+c_2)}$ containing the columns of V and $C_2$ satisfies, for any integer $k > 0$, and with probability $$0.9 - \frac{1}{n},$$

$$\left\| A - \prod_{C,k}^F (A) \right\|_F^2 \leq \|A - A_k\|_F^2 + \frac{30k}{c_2} \|A - VV^\dagger A\|_F^2.$$

The above procedure is denoted as $C_2$=AdaptiveColsSparse(A, V, $c_2$). Given A and V, the algorithm takes $O(nnz(A)\log n + mc_1 \log n + mc_1^2)$ time to find $C_2$.

Lemma 3 may be proven as follows: Define the residual $B = A - VV^\dagger A \in \mathbb{R}^{m \times n}$. From Theorem 1 (for fixed $\epsilon = 0.5$) of Achlioptas (D. Achlioptas; Database-friendly random projections: Johnson-Lindenstrauss with binary coins; J. Comput. Syst. Sci., 66(4):671-687, 2003), let $$\tilde{B} = JLT(B, 1).$$

The lemma gives $$\|\tilde{b}_i\|_2^2 \geq \frac{1}{2} \|b_i\|_2^2.$$

So from Theorem 2.1 of Deshpande II, after using the following distribution for the sampling, $$p_i = \frac{\|\tilde{b}_i\|_2^2}{\|\tilde{B}\|_F^2} \geq \frac{1}{2} \cdot \frac{2}{3} \cdot \frac{\|b_i\|_2^2}{\|B\|_F^2} = \frac{1}{3} \frac{\|b_i\|_2^2}{\|B\|_F^2},$$

one obtains $$\mathbb{E}\left[\left\| A - \prod_{C,k}^F (A) \right\|_F^2\right] \leq \|A - A_k\|_F^2 + \frac{3k}{c_2} \|A - VV^\dagger A\|_F^2.$$

The expectation is taken with respect to the randomness in constructing $C_2$, so $$\mathbb{E}\left[\left\| A - \prod_{C,k}^F (A) \right\|_F^2\right] - \|A - A_k\|_F^2 \leq \frac{3k}{c_2} \|A - VV^\dagger A\|_F^2.$$

The following relation is immediate:

$$\|A - \Pi_{C,k}^F(A)\|_F^2 - \|A - A_k\|_F^2 > 0,$$

so, from Markov's inequality, with probability at least 0.9, $$\left\| A - \prod_{C,k}^F (A) \right\|_F^2 - \|A - A_k\|_F^2 \leq \frac{30k}{c_2} \|A - VV^\dagger A\|_F^2,$$

which implies $$\left\| A - \prod_{C,k}^F (A) \right\|_F^2 \leq \|A - A_k\|_F^2 + \frac{30k}{c_2} \|A - VV^\dagger A\|_F^2.$$

The running time follows by a careful implementation of the random projection step inside the routine in Theorem 1 of Achlioptas. The matrices SA and SV are computed in $O(nnz(A)\log n)$ and $O(mc_1 \log n)$ arithmetic operations, respectively. Computing $V^\dagger$ requires $O(mc_1^2)$ operations, and $(SV)V^\dagger$ takes another $O(mc_1 \log n)$ operations. Computing $(SVV^\dagger)A$ takes $O(nnz(A)\log n)$ operations, and computing $SA-SVV^\dagger A$ takes another $O(n \log n)$ operations. Thus, these steps can be implemented in total time $O(nnz(A)\log n + mc_1 \log n + mc_1^2)$.

Following is developed an input-sparsity-time version of the adaptive sampling algorithm of Theorem 4 in Wang.

The following is referred to herein as Lemma 4: Given $A \in \mathbb{R}^{m \times n}$ and $A \in \mathbb{R}^{m \times n}$ such that $$rank(V) = rank(VV^\dagger A) = \rho,$$

with $\rho \leq c \leq n$, let $R_1 \in \mathbb{R}^{r_1 \times n}$ consist of $r_1$ rows of A. There exists a randomized algorithm to construct $R_2 \in \mathbb{R}^{r_2 \times n}$ with $r_2$ rows such that, for $R = [R_1^T, R_2^T]^T \in \mathbb{R}^{(r_1+r_2) \times n}$, with probability at least $0.9 - 1/n$, $$\|A - VV^\dagger AR^\dagger R\|_F^2 \leq \|A - VV^\dagger A\|_F^2 + \frac{30\rho}{r_2} \|A - AR_1^\dagger R_1\|_F^2.$$

This procedure is denoted as $R_2$=AdaptiveRowsSparse(A, V, $R_1$, $r_2$). Given A, V, $R_1$, the algorithm takes $$O(nnz(A)\log n + nr_1 \log n + nr_1^2)$$

arithmetic operations to find $R_2$.

Lemma 4 may be proven as follows: There is an immediate generalization of Theorem 15 of Wang to the case when the sampling probabilities satisfy $$p_i \geq \alpha \frac{\|b_i\|_2^2}{\|B\|_F^2},$$

for some $\alpha < 1$, rather than just for $\alpha = 1$. This leads to the following version of Theorem 4 of Wang described herein: if the probabilities in that lemma satisfy $$p_i \geq \alpha \frac{\|b_i\|_2^2}{\|B\|_F^2},$$

for some $\alpha<1$, then the bound is $$\mathbb{E}\left[\|A - VV^\dagger AR^\dagger R\|_F^2\right] \leq \|A - VV^\dagger A\|_F^2 + \frac{\rho}{\alpha r_2}\|A - AR_1^\dagger R_1\|_F^2.$$

Given this bound, the proof continues by repeating the ideas used in Lemma 3. Although the proof is similar to that in Lemma 3, a proof is included herein for completeness.

Define the residual $$B = A - AR_1^\dagger R_1 \in \mathbb{R}^{m \times n}.$$

From Theorem 1 in Achlioptas, let $$\tilde{E} = JLT(B, 1).$$

Given that, it is the case that $$\|\tilde{b}_i\|_2^2 \geq \frac{1}{2}\|b_i\|_2.$$

Using for the sampling the distribution $$p_i = \frac{\|\tilde{b}_i\|_2^2}{\|\tilde{B}\|_F^2} \geq \frac{1}{2} \cdot \frac{2}{3} \cdot \frac{\|b_i\|_2^2}{\|B\|_F^2} = \frac{1}{3}\frac{\|b_i\|_2^2}{\|B\|_F^2},$$

one may obtain $$\left[\|A - VV^\dagger AR^\dagger R\|_F^2\right] \leq \|A - VV^\dagger A\|_F^2 + \frac{3\rho}{r_2}\|A - AR_1^\dagger R_1\|_F^2.$$

The expectation is taken with respect to the randomness in constructing $R_2$, so $$\mathbb{E}\left[\|A - VV^\dagger AR^\dagger R\|_F^2 - \|A - VV^\dagger A\|_F^2\right] \leq \frac{3\rho}{r_2}\|A - AR_1^\dagger R_1\|_F^2.$$

It follows that $$\|A - VV^\dagger AR^\dagger R\|_F^2 - \|A - VV^\dagger A\|_F^2 > 0$$

since $$\|A - VV^\dagger AR^\dagger R\|_F^2 = \|A - VV^\dagger A + VV^\dagger A - VV^\dagger AR^\dagger R\|_F^2 = \|A - VV^\dagger A\|_F^2 + \|VV^\dagger A - VV^\dagger AR^\dagger R\|_F^2.$$

Hence, by Markov's inequality, with probability at least 0.9, $$\|A - VV^\dagger AR^\dagger R\|_F^2 - \|A - VV^\dagger A\|_F^2 \leq +\frac{30\rho}{r_2}\|A - AR_1^\dagger R_1\|_F^2,$$

which implies $$\|A - VV^\dagger AR^\dagger R\|_F^2 \leq \|A - VV^\dagger A\|_F^2 + \frac{30\rho}{r_2}\|A - AR_1^\dagger R_1\|_F^2.$$

The running time follows by a careful implementation of the random projection step inside the routine in Theorem 1 of Achlioptas. Computing SA may occur in $O(nnz(A)\log n)$ arithmetic operations. Computing $R_1^\dagger$ requires $O(nr_1^2)$ operations. Computing $((SA)V^\dagger)R_1$ requires another $O(nr_1 \log n)$ operations. Computing $SA - SAR_1^\dagger R_1$ requires $O(n \log n)$ operations. Thus, all these operations can be implemented in $O(nnz(A) \log n + nr_1 \log n + nr_1^2)$ time.

Below, a deterministic, polynomial-time CUR algorithm is presented in Algorithm 4. More precisely, the algorithm constructs C and R with rescaled columns and rows from A. To convert this to a truly CUR decomposition, one may keep the un-rescaled versions of C and R and introduce the scaling factors in U.

The algorithm description below closely follows the CUR proto-algorithm in Algorithm 1. Algorithm 4 may be implemented on a computer system in hardware, software, or a combination thereof. Various operations performed in this algorithm follow immediately below:

Input: $A \in \mathbb{R}^{m \times n}$; rank parameter $k < \text{rank}(A)$; and accuracy parameter $0 < \epsilon < 1$.

Output: $C \in \mathbb{R}^{m \times c}$ with $c = O(k/\epsilon)$; $R \in \mathbb{R}^{r \times n}$ with $r = O(k/\epsilon)$; $U \in \mathbb{R}^{c \times r}$ with $\text{rank}(U) = k$.

Construct C with $O(k + k/\epsilon)$ columns. This includes the operations of (1a)-(1d).

(1a) $Z_1 = \text{DeterministicSVD}(A, k, 1)$; $Z_1 \in \mathbb{R}^{m \times k}$ ($Z_1^T Z_1 = I_k$); $E_1 = A - AZ_1 Z_1^T \in \mathbb{R}^{m \times n}$.

(1b) $S_1 = \text{BssSampling}(V_{M_1}, E_1^T, C_1)$, with $c_1 = 4k$, $S_1 \in \mathbb{R}^{h_2 \times c_1}$.

$c_1 = AS \in \mathbb{R}^{m \times c_2}$ containing rescaled columns of A.

(1c) $C_2 = \text{AdaptiveColsD}(A, C_1, 1, c_2)$; with $$c_2 = \frac{10k}{s} \text{ and } C_2 \in \mathbb{R}^{m \times c_2}$$

columns of A.

$C = [C_1 C_2] \in \mathbb{R}^{m \times c}$ containing $$c = c_1 + c_2 = 4k + \frac{10k}{s}$$

rescaled columns of A.

(2) Construct R with $O(k + l/\epsilon)$ rows. This includes operations of (2a)-(2d).

(2a) $[Y, \Psi, \Delta] = \text{BestSubspaceSVD}(A, C, k)$; $Y \in \mathbb{R}^{m \times c}$, $\Psi \in \mathbb{R}^{c \times c}$, $\Delta \in \mathbb{R}^{c \times k}$; $B = Y\Delta$.

$B = Z_2 D$ is a qr-factorization of B with $Z_2 \in \mathbb{R}^{m \times k}$ ($Z_2^T Z_2 = I_k$), $D \in \mathbb{R}^{k \times k}$, and $E_2 = A^T - A^T Z_2 Z_2^T$.

(2b) $S_2 = \text{BssSampling}(V_{M_2}, (E_2)^T, r_1)$, with $r_1 = 4k$ and $S_2 \in \mathbb{R}^{h_2 \times r_2}$.

$R_1 = (A^T S_2)^T \in \mathbb{R}^{r_s \times n}$ containing rescaled rows from A.

(2c) $R_2 = \text{AdaptiveRowsD}(A, Z_2, R_1, r_2)$, with $$r_2 = \frac{10k}{s} \text{ and } R_2 \in \mathbb{R}^{r_2 \times n}$$

with rows of A.

$R = [R_1^T, R_2^T]^T \in \mathbb{R}^{(r_2 + r_2) \times n}$ containing $$r = 4k + \frac{10k}{s}$$

rescaled rows of A.

(3) Construct U of rank k. This includes the operations of (3a).

(3a) Construct $U \in \mathbb{R}^{c \times r}$ with rank at most k as follows, where the following formulas are equivalent:

$$U = \Psi^{-1}\Delta D^{-1}Z_2^T A R^\dagger = \Psi^{-1}\Delta D^{-1}(C\Psi^{-1}\Delta D^{-1})^T A R^\dagger$$
$$= \Psi^{-1}\Delta D^{-1}(C\Psi^{-1}\Delta D^{-1})^\dagger A R^\dagger$$
$$= \Psi^{-1}\Delta D^{-1}D\Delta^T \Psi C^\dagger A R^\dagger$$
$$= \Psi^{-1}\Delta\Delta^T \Psi C^\dagger A R^\dagger.$$

Algorithm 4 may take as input an in m×n matrix A, rank parameter k<rank(A), and accuracy parameter 0<ε<1. These are also the inputs of the CUR Problem. The algorithm may return matrix $C \in \mathbb{R}^{m \times c}$ with c=O(k/ε) columns of A, matrix $R \in \mathbb{R}^{r \times n}$ with r=O(k/ε) rows of A, and matrix $U \in \mathbb{R}^{c \times r}$ with rank at most k. Algorithm 4 may closely follow the CUR proto-algorithm of Algorithm 1. More particularly, Algorithm 4 may make specific choices for the various operations of the proto-algorithm that can be implemented deterministically in polynomial time.

In some embodiments, Algorithm 4 may run as follows: (1) An optimal number of columns may be selected in C. (2) An optimal number of rows may be selected in R. And (3) an intersection matrix with optimal rank may be constructed and denoted as U. The algorithm itself may integrate one or more other algorithms, including new algorithms as well as existing ones combined in a novel manner. Specifically, Algorithm 4 refers to DeterministicSVD, which is described in Theorem 3.1 in Ghashami (M. Ghashami and J. Phillips; Relative errors for deterministic low-rank matrix approximations; In SODA, 2013); BssSampling, which is described in Lemma 3.6 of Boutsidis; AdaptiveColsD, which is described in Lemma 5; BestSubspaceSVD, which is described in Clarkson II; and AdaptiveRowsD, which is described in Lemma 6.

Figure 4:
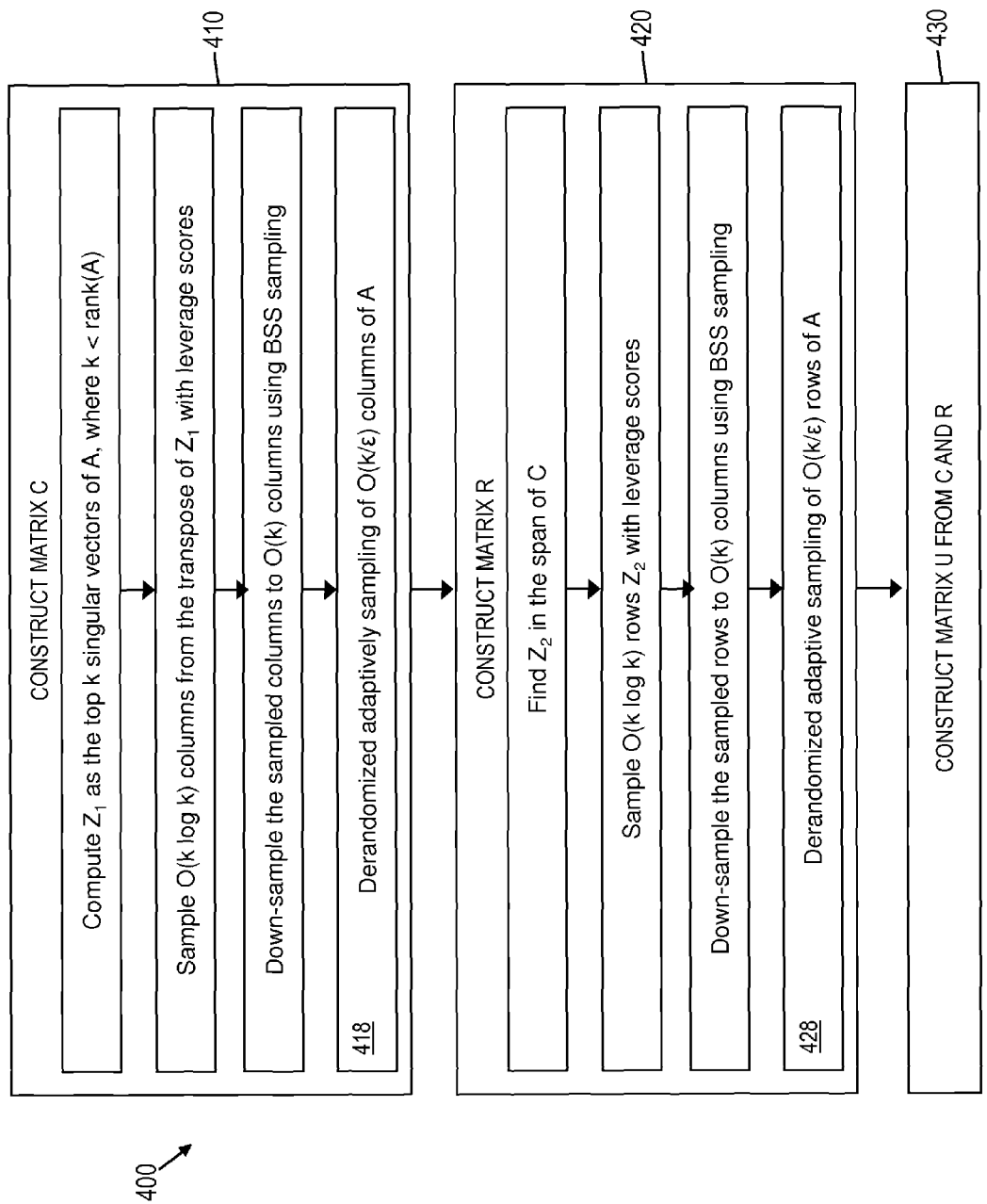
FIG. 4 is a flow diagram of a third method for finding a deterministic CUR decomposition of a matrix A, according to some embodiments of this disclosure.

FIG. 4 is a flow diagram of a method 400 for finding a deterministic CUR decomposition of a matrix A, using Algorithm 4, according to some embodiments of this disclosure. At a high level, matrix C may be constructed with O(k/ε) columns at block 410, matrix R may be constructed with O(k/ε) rows at block 420, and matrix U may be constructed from matrices C and R at block 430. The decomposition method 400 of FIG. 4 is similar to the decomposition method 200 of FIG. 2, except that, as shown at blocks 418 and 428, the adaptive sampling performed may be derandomized, as will be described further below.

It can be shown that the above algorithm runs in a total time of $O(mn^3k/\epsilon)$.

With respect to error bounds, it can be further shown that matrices C, U, and R in Algorithm 4 satisfy, $$\|A - CUR\|_F^2 \leq \|A - A_k\|_F^2 + 8\epsilon \|A - A_k\|_F^2.$$

The above Algorithm 4 may include other algorithms, some of which exist in the art and some of which are newly provided in this disclosure. Below, those that are new are described in detail. As a starting point, below, a lemma is proven regarding derandomizing the adaptive sampling procedure of Deshpande II. The lemma offers a deterministic adaptive sampling algorithm used in the above deterministic CUR algorithm.

The following is referred to herein as Lemma 5: Given $A \in \mathbb{R}^{m \times n}$ and $V \in \mathbb{R}^{m \times c_1}$ (with $c_1 \leq n$, m), let the residual be defined as $$B = A - VV^\dagger A \in \mathbb{R}^{m \times n}.$$

There exists a deterministic algorithm to construct $C_2 \in \mathbb{R}^{m \times c_2}$ containing columns of A, such that $C = [V \; C_2] \in \mathbb{R}^{m \times (c_2 + c_2)}$ i.e., the matrix that contains the columns of V and $C_2$, satisfies, for any integer k>0, $$\left\|A - \prod_{C,k}^F (A)\right\|_F^2 \leq \|A - A_k\|_F^2 + \frac{4k}{c_2}\|A - VV^\dagger A\|_F^2.$$

The above procedure is denoted as $C_2$=AdaptiveColsD(A, V, $c_2$). Given A and V, the algorithm requires $O(mn^3c)$ arithmetic operations to find $C_2$. Here $c = c_1 + c_2$.

Lemma 5 may be proven as follows: This lemma corresponds to a derandomization of Theorem 2.1 of Deshpande II. It suffices to derandomize Theorem 2.1 of Deshpande II, since the above lemma is equivalent to the theorem by taking transposes. This disclosure now switches to the notation to that of Deshpande II for the sake of clarity. In that theorem, $E = A - AVV^T$, and a random sample S of s rows of A are chosen from a distribution p with $$p_l = \|E^{(l)}\|_2^2 / \|E\|_F^2.$$

for each $l \in [m]$, and independently for each of the s trials. It will be understood that s corresponds to $c_{\cdot 2}$ in the notation herein. It is shown in Deshpande II that if $PP^T$ is a projection operator onto the space spanned by the s sampled rows together with the rows of V, then there is a rank-k approximation to A, denoted $A^T$, in the row space of P for which $$E_S\|A - A'\|_F^2 \leq \|A - A_k\|_F^2 + \frac{k}{s}\|E\|_F^2.$$

To derandomize Theorem 2.1 of Deshpande II, the distribution p is discretized, defining a new distribution q. Let $l^* \in [n]$ be such that $p_{l^*} \geq p_i$ for all $i \neq i^*$. Then, let $$r_{i^*} = p_{i^*} + \sum_{i \neq i^*} p_i / 2;$$

hence, r is a distribution. Round each $r_i$, $i \neq i^*$, up to the nearest integer multiple of 1/(4n) by adding $y_i$, and let $q_i$ be the resulting value. For $q_{i^*}$, let $q_{i^*} = r_{i^*} - \Sigma_{i \neq i^*} y_i$. Then $\Sigma_i q_i = 1$ and $0 \leq q_i \leq 1$ for all i. Consider $q_{i^*}$. Then, $$0 \leq \sum_{i \neq i^*} y_i \leq n * (1/(4n)) = 1/4.$$

On the other hand $$r_{i^*} = p_{i^*} + \sum_{i \neq i^*} p_i / 2 \geq \sum_i p_i / 2 = 1/2.$$

Hence $q_{i^*} \in [0,1]$ as well. Hence q is a distribution. It should be noted that, for all $i \neq i^*$, $q_i \geq r_i \geq p_i/2$. Moreover, $q_{i^*} \geq r_{i^*} - 1/4 \geq 1/4$, so $q_{i^*} \geq p_{i^*}/4$. Thus, all $q_i$ are within a factor of 4 from $p_i$, $q_i \geq p_i/4$.

Following, as compared to the proof of Theorem 2.1 of Deshpande distribution p is replaced with q. As in the proof of Deshpande II, vectors $w^{(1)}, \ldots, w^{(k)}$ are defined in the column span of P such that there exists a rank-k approximation to A, denoted $A^1$, whose rows are spanned by these vectors and for which $$E_S \|A - A'\|_P^2 \le \|A - A_k\|_F^2 + \frac{k}{s}\|E\|_F^2.$$

This suffices to prove the theorem.
Define $$X_l^{(j)} = \frac{u_i^{(j)} E^{(i)}}{q_i},$$

with probability $q_i$, where $l \in [s]$ and $l \in [m]$, $E^{(i)}$ denotes the i-th row of E, and $u^{(j)}$ is the j-th left singular vector of A. As in the proof of Deshpande II, define $$X^{(j)} = \frac{1}{s}\sum_{l=1}^{s} X_l^{(j)}.$$

In that case, $E_s[X^{(j)}] = E^T u^{(j)}$. Define $w^{(j)} = VV^T A^T u^{(j)} + X^{(j)}$, so that $E_s[w^{(j)}] = \sigma_j v^{(j)}$, where $\sigma_j$ is the j-th singular value of A, and $v^{(j)}$ the j-th right singular vector. The same calculation as in Equations 2.4 and 2.5 of the proof of Deshpande II gives $$E_S \|w^{(j)} - \sigma_j v^{(j)}\|^2 = \frac{1}{s^2}\sum_{l=1}^{s} E[\|X_l^{(j)}\|^2] - \frac{1}{s}\|E^T u^{(j)}\|^2,$$

as in Equation 2.6 of Deshpande II, where pairwise independence suffices for this aspect.
Based on the above, it is given that $$E_S\|X_l^{(j)}\|_2^2 = \sum_{i=1}^{m} q_i \frac{\|u_i^{(j)} E^{(i)}\|^2}{q_i^2}$$

$$\le \frac{\|u_{i*}^{(j)} E^{(i*)}\|_2^2}{\frac{1}{4}\frac{\|E^{(i*)}\|_2^2}{\|E\|_F^2}} + \sum_{i \ne i*} \frac{\|u_i^{(j)} E^{(i)}\|_2^2}{\frac{\|E^{(i)}\|_2^2}{\|E\|_F^2}}$$

$$\le 4\|E\|_F^2.$$

This is a slightly weaker upper bound than using distribution p, which Deshpande II shows in its Equation 2.8

$$E_S\|X_l^{(j)}\|_2^2 \le \|E\|_F^2.$$

The constant 4 makes little difference for this disclosure purposes, while the fact that q is discrete assists with derandomization.
Equation 2.8 of Deshpande II changes to $$E_S\|w^{(j)} - \sigma_j v^{(j)}\|^2 \le \frac{4}{s}\|E\|_F^2.$$

The rest of the proof is as in Deshpande II, showing that, if $PP^T$ is a projection operator onto the space spanned by the s sampled rows together with the columns of V, then there is a rank-k approximation of A, denoted $A^1$ in the column space of P for which $$E_S\|A - A'\|_P^2 \le \|A - A_k\|_F^2 + \frac{4k}{s}\|E\|_F^2.$$

In particular there exists a choice of S for which, for the corresponding $A^1$ it is the case that $$\|A - A'\|_P^2 \le \|A - A_k\|_F^2 + \frac{4k}{s}\|E\|_F^2.$$

Distribution q is a discrete distribution, and the trials need only be pairwise independent. Let $h:[c_2] \to [4n]$ be drawn from a pairwise-independent hash function family F. In that case, F need only have size $O(n^2)$, as described in Carter (L. Carter and M. N. Wegman; Universal classes of hash functions. J. Comput. Syst. Sci., 18(2):143-154, 1979). For each trial $l \in [s]$, h(l) is computed. Since the probabilities $q_i$, where $i=1, \ldots, n$, are integer multiples of $1/(4n)$ and $\Sigma_i q_i = 1$, the largest $i \Sigma[n]$ for which $h(l)/(4n) \le \Sigma_{i*=1}^{i} q_1$ is selected. The probability of picking i in each trial is therefore $q_i$. For each $h \in F$, the corresponding sample set s is computed, along with the best rank-k approximation $A^1$ of A in the space spanned by the s sampled rows together with the rows of V. $\|A - A^1\|_F$ is then computed. The S with the smallest such value is chosen. Computing this value can be done in $O(mn(c_1+c_2) + n(c_1+c_2)^2 + mn)$ time, and since $|F| = O(n^2)$, the overall time is $O(mn^3(c_1+c_2))$.

Following is a proof for a lemma derandomizing the recent row/column adaptive sampling method of Wang, which is stated in Theorem 4 therein. The following lemma in general does not necessarily imply the previous lemma due to the fact that the previous lemma concerned approximating A by a rank-k matrix, whereas the following lemma concerns approximating A by a matrix of rank $\rho$, which is in general different than k. By setting $V = A_k$ and getting the transpose version of the result, one gets only a version of the previous lemma with $A - CC^\dagger A$ in the left hand side. Nevertheless, the derandomization arguments are similar.

The following is referred to herein as Lemma 6: Given $A \in \mathbb{R}^{m \times n}$ and $V \in \mathbb{R}^{m \times c}$, such that $$rank(V) = rank(VV^\dagger A) = \rho,$$

with $\rho \le c \le n$, let $R_1 \in \mathbb{R}^{r_s \times n}$ contain $r_1$ rows of A. There exists a deterministic algorithm to construct $R_2 \in \mathbb{R}^{r_s \times n}$ with $r_2$ rows such that for $R = [R_1^T, R_2^T]^T \in \mathbb{R}^{(r_s+r_s) \times n}$, it is the case that $$\|A - VV^\dagger AR^\dagger R\|_F^2 \|A - VV^\dagger A\|_F^2 + \frac{4\rho}{r_2}\|A - AR_1^\dagger R_1\|_F^2.$$

The above procedure is denoted herein as $R_2 = \text{AdaptiveRowsD}(A, V, R_1, r_2)$. Given A, V, and $R_1$, it takes $O(n^2(mc^2 + nr^2 + mnc + mnr))$ time to find $R_2$. Here $c = c_1 + c_2$, $r = r_1 + r_2$.

Lemma 6 may be proven as follows: This lemma corresponds to a derandomization of Theorem 5 of Wang. The matrix C in the proof of Wang corresponds to the matrix V herein. Despite the notation of Wang, as that reference states in its theorem statement and proves, the matrix C need not be a subset of columns of A. To prove the theorem, Wang actually restates it as Theorem 15 in that paper, switching the role of rows and columns, which will now be derandomized herein. Lemma 6 herein follows by taking transposes.

In that theorem of Wang, the authors define a distribution p on n columns $b_1, \ldots, b_n$ where $B=A-C_1C_1^\dagger A$ for a matrix $C_1 \in \mathbb{R}^{m \times c_1}$ having $c_1$ columns of A. In their, proof they show that, for $p_i = \|b_i\|_2^2 / \|B\|_F^2$, if one samples $c_2$ columns of A in independent and identically distributed trials, where in each trial the i-th column is chosen with probability $p_i$, then if $C_2 \in \mathbb{R}^{m \times c_s}$ has the $c_2$ sampled columns, and $C=[C_1, C_2] \in \mathbb{R}^{m \times (c_2+c_2)}$, then $$E_{C_2} \|A - CC^\dagger AR^\dagger R\|_F^2 \leq \|A - AR^\dagger R\|_F^2 + \frac{\rho}{c_2} \|A - C_1 C_1^\dagger A\|_F^2.$$

To derandomize Theorem 5 of Wang, this disclosure discretizes the distribution p, defining a new distribution q. Let $i^* \in [n]$ be such that $p_{i^*} \geq p_i$ for all $i \neq i^*$. Then, let $$r_{i^*} = p_{i^*} + \sum_{i \neq i^*} p_i / 2;$$

hence, r is a distribution. Round each $r_i$, $i \neq i^*$, up to the nearest integer multiple of $1/(4n)$ by adding $y_i$, and let $q_i$ be the resulting value. For $q_{i^*}$, let $q_{i^*} = r_{i^*} - \Sigma_{ii = \epsilon^* \eta}$. It follows that $\Sigma_i q_i = 1$ and $0 \leq q_i \leq 1$ for all 1. When $q_{i^*}$ is considered, then $0 \leq \Sigma_{i \neq i^*} Y_i \leq n^*(1/(4n)) = 1/4$. On the other hand, $r_{i^*} = p_{i^*} + \Sigma_{i \neq i^*} p_i / 2 \geq \Sigma_1 p_1 / 2 = 1/2$. Hence, $q_{i^*} \in [0,1]$ as well. Thus, q is a distribution. For all $i \neq i^*$, $q_1 \geq r_i \geq p_1/2$. Moreover, $q_{i^*} \geq r_{i^*} - 1/4 \geq 1/4$, so $q_{i^*} \geq p_{i^*}/4$. Therefore, all $q_i$ are within a factor of 4 from $p_i q_i \geq p_i / 4$.

Follow the argument in the proof of Theorem 15 of Wang, distribution p is replaced with q below, pointing out the differences. Fefine the random variable $$x_{j,(l)} = \frac{v_{i,j}}{q_i} b_i,$$

where $v_{i,j}$ is the (i,j)-th entry of $V_{AR\backslash R,p} \in \mathbb{R}^{n \times p}$, where $V_{AR\backslash R,p} \in \mathbb{R}^{n \times p}$ denotes the matrix of the top p right singular vectors of AR\R. It is the case that $$[x_{j,(l)}] = \sum_{i=1}^n q_i \frac{v_{i,j}}{q_i} b_i = Bv_j.$$

Moreover, $$E\|x_{j,(l)}\|_2^2 = \sum_{i=1}^n q_i \frac{v_{i,j}^2}{q_i^2} \|b_i\|_2^2 \leq \frac{v_{i^*,j}^2 \|b_{i^*}\|_2^2}{\frac{\|b_{i^*}\|^2}{4\|B\|_F^2}} + \sum_{i \neq i^*} \frac{v_{i,j}^2 \|b_i\|_2^2}{\frac{\|b_{i^*}\|^2}{\|B\|_F^2}} \leq 4\|B\|_F^2.$$

This is slightly weaker than the corresponding upper bound of $E\|x_{j,(l)}\|_2^2 \leq \|B\|_F^2$ shown for distribution p in Wang, but the constant 4 makes little difference for the purposes of this disclosure, while the fact that q is discrete assists with derandomization.

Let $$x_j = \frac{1}{c_2} \sum_{l=1}^{c_2} x_{j,(l)}.$$

By linearity of expectation, $E[x_j] = E[x_{j,(l)}] = Bv_j$.

In bounding $E\|x_j - Bv_j\|_2^2$, pairwise independence of the trials is enough to bound this quantity:

$$E\|x_j - Bv_j\|_2^2 = E\|x_j - E[x_j]\|_2^2 = \frac{1}{c_2} E\|x_{j,(l)} - E[x_{j,(l)}]\|_2^2 = \frac{1}{c_2} E\|x_{j,(l)} - Bv_j\|_2^2$$

(referred to herein as Equation 4), where the second equality uses pairwise-independence, as it corresponds to the sum of the variances being the variance of the sum.

The remainder of the proof of Theorem 15 in Wang only uses their slightly stronger bound, as compared to Equation 4 herein. With the weaker bound herein, Wang would obtain $$E_{C_2} \|A - CC^\dagger AR^\dagger R\|_F^2 \leq \|A - AR^\dagger R\|_F^2 + \frac{4\rho}{c_2} \|B\|_F^2.$$

whereas the bound of Wang would not have the factor of 4. In particular, there exists a choice of $C_2$ for which, for the corresponding C, it is the case that $$\|A - CC^\dagger AR^\dagger R\|_F^2 < \|A - AR^\dagger R\|_F^2 + \frac{4\rho}{c_2} \|B\|_F^2.$$

Distribution q is a discrete distribution, and the trials need only be pairwise independent. Let $h:[c_2] \to [4n]$ be drawn from a pairwise-independent hash function family F. Then F need only have size $O(n^2)$, as described in Carter. For each trial $l \in [c_2]$, compute h(l) is computed. Since the probabilities $q_i$, for $1, \ldots, n$, are integer multiples of $1/(4n)$ and $\Sigma_i q_1 = 1$, the largest $i \in [n]$ for which $h(l)/(4n) \leq \Sigma_{j*=1}^i q_i$ is selected. The probability of picking i in the each trial is therefore $q_i$. For each $h \in F$, the corresponding column samples $C_2$ is computed, along with $\|A - CC^\dagger AR^\dagger R\|_F^2$. The $C_2$ resulting in the smallest such value may be chosen.

Computing this value can be done in $O(mc^2+nr^2+mnr+mnc+mn)$ time, and since $|F|=O(n^2)$, the overall time is $O(n^2(mc^2+nr^2+mnr+mnc))$. Here $c=c_1+c_2$, $r=r_1+r_2$.

FIG. 5 illustrates a block diagram of a computer system 500 for use in implementing a decomposition system 100 or method according to some embodiments. The decomposition systems 100 and methods described herein may be implemented in hardware, software (e.g., firmware), or a combination thereof. In an exemplary embodiment, the methods described may be implemented, at least in part, in hardware and may be part of the microprocessor of a special or general-purpose computer system 500, such as a personal computer, workstation, minicomputer, or mainframe computer.

In an exemplary embodiment, as shown in FIG. 5, the computer system 500 includes a processor 505, memory 510 coupled to a memory controller 515, and one or more input devices 545 and/or output devices 540, such as peripherals, that are communicatively coupled via a local I/O controller 535. These devices 540 and 545 may include, for example, a printer, a scanner, a microphone, and the like. A conventional keyboard 550 and mouse 555 may be coupled to the I/O controller 535. The I/O controller 535 may be, for example, one or more buses or other wired or wireless connections, as are known in the art. The I/O controller 535 may have additional elements, which are omitted for simplicity, such as controllers, buffers (caches), drivers, repeaters, and receivers, to enable communications.

The I/O devices 540, 545 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 505 is a hardware device for executing hardware instructions or software, particularly those stored in memory 510. The processor 505 may be any custom made or commercially available processor, a central processing unit (CPU), an auxiliary processor among several processors associated with the computer system 500, a semiconductor based microprocessor (in the form of a microchip or chip set), a macroprocessor, or other device for executing instructions. The processor 505 includes a cache 570, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 570 may be organized as a hierarchy of more cache levels (L1, L2, etc.).

The memory 510 may include any one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD -ROM), disk, diskette, cartridge, cassette or the like, etc.). Moreover, the memory 510 may incorporate electronic, magnetic, optical, or other types of storage media. Note that the memory 510 may have a distributed architecture, where various components are situated remote from one another but may be accessed by the processor 505.

The instructions in memory 510 may include one or more separate programs, each of which comprises an ordered listing of executable instructions for implementing logical functions. In the example of FIG. 5, the instructions in the memory 510 include a suitable operating system (OS) 511. The operating system 511 essentially may control the execution of other computer programs and provides scheduling, input-output control, file and data management, memory management, and communication control and related services.

Additional data, including, for example, instructions for the processor 505 or other retrievable information, may be stored in storage 520, which may be a storage device such as a hard disk drive or solid state drive. The stored instructions in memory 510 or in storage 520 may include those enabling the processor to execute one or more aspects of the decomposition systems 100 and methods of this disclosure.

The computer system 500 may further include a display controller 525 coupled to a display 530. In an exemplary embodiment, the computer system 500 may further include a network interface 560 for coupling to a network 565. The network 565 may be an IP-based network for communication between the computer system 500 and any external server, client and the like via a broadband connection. The network 565 transmits and receives data between the computer system 500 and external systems. In an exemplary embodiment, the network 565 may be a managed IP network administered by a service provider. The network 565 may be implemented in a wireless fashion, e.g., using wireless protocols and technologies, such as WiFi, WiMax, etc. The network 565 may also be a packet-switched network such as a local area network, wide area network, metropolitan area network, the Internet, or other similar type of network environment. The network 565 may be a fixed wireless network, a wireless local area network (LAN), a wireless wide area network (WAN) a personal area network (PAN), a virtual private network (VPN), intranet or other suitable network system and may include equipment for receiving and transmitting signals.

Decomposition systems 100 and methods according to this disclosure may be embodied, in whole or in part, in computer program products or in computer systems 500, such as that illustrated in FIG. 5.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for reducing storage space occupied by a matrix A, the computer-implemented method comprising:

constructing, by a first hardware circuit, a matrix C based on the matrix A, wherein the constructing the matrix C based on the matrix A comprises:

computing $Z_1$ as the top k singular vectors of A, wherein a scalar k is a target rank of a matrix U and is selected to be less than the rank of the matrix A, wherein $A_k$ is a rank-k approximation of the matrix A, wherein a scalar $\epsilon$ is between 0 and 1 and represents a selected accuracy parameter, and wherein $\|A - AZ_1 Z_1^T\|_F^2 \leq (1+\epsilon)\|A - A_k\|_F^2$;

sampling $O(k \log k)$ columns from the transpose of $Z_1$, wherein the sampling uses leverage scores;

down-sampling the sampled columns to $C_1$ comprising $c_1 = O(k)$ columns, wherein $\|A\ C_1 C_1^\dagger\|_F^2 \leq O(1)\|A - AZ_1 Z_1^T\|_F^2$; and adaptively sampling $c_2=O(k/\epsilon)$ columns of A, wherein $$\|A-C\cdot D\|_F^2 \leq \|A-A_k\|_F^2 + \left(\frac{k}{c_2}\right)\|A-C_1C_1^\dagger A\|_F^2,$$

wherein D is selected to be a rank-k matrix;
constructing, by a second hardware circuit distinct from the first hardware circuit, a matrix R based on the matrix A and the matrix C;
constructing, by a third hardware circuit distinct from the first hardware circuit and the second hardware circuit, the matrix U based on the matrices A, C, and R;
wherein the matrices C, U, and R comprise a CUR decomposition of the matrix A;
reducing storage space occupied by the matrix A by replacing the matrix A with the matrices C, U, and R.

2. The method of claim 1, wherein the constructing the matrix R based on the matrix A and the matrix C comprises:

$$\|A-AZ_1Z_1^T\|_F^2 \leq (1+\varepsilon)\|A-A_R\|_F^2\|A-C_1C_1^\dagger\|_F^2 \leq$$
$$O(1)\|A-AZ_1Z_1^T\|_F^2\|A-C\cdot D\|_F^2 \leq \|A-A_k\|_F^2 + \left(\frac{k}{c_2}\right)\|A-C_1C_1^\dagger A\|_F^2;$$

and finding $Z_2$ in the span of the matrix C, wherein $\|A-AZ_2Z_2^T\|_F^2 \leq (1+\epsilon)\|A-A_k\|_F^2$;
sampling $O(k \log k)$ rows of $Z_2$, wherein the sampling uses leverage scores;
down-sampling the sampled rows to $R_1$ comprising $r_1=O(k)$ columns using BSS sampling, wherein $\|A R_1 R_1^\dagger\|_F^2 \leq O(1)\|A AZ_2Z_2^T A\|_F^2$; and
adaptively sampling $r_2=O(k/\epsilon)$ rows of A, wherein $$\|A-Z_2Z_2^T AR^\dagger R\|_F^2 \leq \|A-Z_2Z_2^T A\|_F^2 + \text{rank}\left(\frac{Z_1Z_2^T A}{r_2}\right)\|A-AR_1R_1^\dagger\|_F^2.$$

3. The method of claim 2, further comprising projecting one or more columns of the matrix A*W onto the matrix C, wherein the matrix W is a random subspace embedding.

4. The method of claim 2, wherein:
down-sampling the sampled columns to $C_1$ comprising $c_1=O(k)$ columns using BSS sampling uses an input-sparsity-time BSS sampling algorithm;
adaptively sampling $c_2=O(k/\epsilon)$ columns of A occurs in input-sparsity time;
down-sampling the sampled rows to $R_1$ comprising $r_1=O(k)$ columns using BSS sampling uses the input-sparsity-time BSS sampling algorithm;
adaptively sampling $r_2=O(k/\epsilon)$ rows of A occurs in input-sparsity time; and
constructing the matrix U based on the matrices A, C, and R is performed in input-sparsity time.

5. The method of claim 4, wherein the construction of the matrices C, U, and R occurs in input-sparsity time.

6. The method of claim 2, wherein:
adaptively sampling $c_2=O(k/\epsilon)$ columns of A comprises derandomization; and
adaptively sampling $r_2=O(k/\epsilon)$ rows of A comprises derandomization.

7. The method of claim 6, wherein the construction of the matrices C, U, and R comprises a deterministic CUR decomposition.

8. A system for reducing storage space occupied by a matrix A, the system comprising:
a memory; and
one or more processors, communicatively coupled to the memory, the one or more processors configured to:
construct, by a first hardware circuit, a matrix C based on the matrix A, wherein the constructing the matrix C based on the matrix A comprises:
computing $Z_1$ as the top k singular vectors of A, wherein a scalar k is a target rank of a matrix U and is selected to be less than the rank of the matrix A, wherein $A_k$ is a rank-k approximation of the matrix A, wherein a scalar $\epsilon$ is between 0 and 1 and represents a selected accuracy parameter, and wherein $\|A-AZ_1Z_1^T\|_F^2 \leq (1+\epsilon)\|A-A_k\|_F^2$;
sampling $O(k \log k)$ columns from the transpose of $Z_1$, wherein the sampling uses leverage scores;
down-sampling the sampled columns to $C_1$ comprising $c_1=O(k)$ columns, wherein $\|A C_1C_1^\dagger\|_F^2 \leq O(1)\|A AZ_1Z_1^T\|_F^2$; and
adaptively sampling $c_2=O(k/\epsilon)$ columns of A, wherein $$\|A-C\cdot D\|_F^2 \leq \|A-A_k\|_F^2 + \left(\frac{k}{c_2}\right)\|A-C_1C_1^\dagger A\|_F^2,$$

wherein D is selected to be a rank-k matrix;
construct, by a second hardware circuit distinct from the first hardware circuit, a matrix R based on the matrix A and the matrix C; and
construct, by a third hardware circuit distinct from the first hardware circuit and the second hardware circuit, the matrix U based on the matrices A, C, and R;
wherein the matrices C, U, and R comprise a CUR decomposition of the matrix A; and
reduce storage space occupied by the matrix A by replacing the matrix A with the matrices C, U, and R.

9. The system of claim 8, wherein to construct the matrix R based on the matrix A and the matrix C, the one or more processors are further configured to:

$$\|A-AZ_1Z_1^T\|_F^2 \leq (1+c)\|A-A_k\|_F^2\|A-C_1C_1^\dagger\|_F^2 \leq$$
$$O(1)\|A-AZ_1Z_1^T\|_F^2\|A-C\cdot D\|_F^2 \leq \|A-A_k\|_F^2 + \left(\frac{k}{c_2}\right)\|A-C_1C_1^\dagger A\|_F^2;$$

and find $Z_2$ in the span of the matrix C, wherein $\|A-AZ_2Z_2^T\|_F^2 \leq (1+\epsilon)\|A-A_k\|_F^2$;
sample $O(k \log k)$ rows of $Z_2$, wherein the sampling uses leverage scores;
down-sample the sampled rows to $R_1$ comprising $r_1=O(k)$ columns using BSS sampling, wherein $\|A-R_1R_1^\dagger\|_F^2 \leq O(1)\|A-AZ_2Z_2^T A\|_F^2$; and
adaptively sample $r_2=O(k/\epsilon)$ rows of A, wherein $$\|A-Z_2Z_2^T AR^\dagger R\|_F^2 \leq \|A-Z_2Z_2^T A\|_F^2 + \text{rank}\left(\frac{Z_1Z_2^T A}{r_2}\right)\|A-AR_1R_1^\dagger\|_F^2.$$

10. The system of claim 9, wherein the one or more processors are further configured to project one or more columns of the matrix A*W onto the matrix C, and wherein the matrix W is a random subspace embedding.

11. The system of claim 9, wherein:
down-sampling the sampled columns to $C_1$ comprising $c_1=O(k)$ columns using BSS sampling uses an input-sparsity-time BSS sampling algorithm;
adaptively sampling $c_2=O(k/\epsilon)$ columns of A occurs in input-sparsity time;
down-sampling the sampled rows to $R_1$ comprising $r_1=O(k)$ columns using BSS sampling uses the input-sparsity-time BSS sampling algorithm;
adaptively sampling $r_2=O(k/\epsilon)$ rows of A occurs in input-sparsity time; and
constructing the matrix U based on the matrices A, C, and R is performed in input-sparsity time.

12. The system of claim 11, wherein the construction of the matrices C, U, and R occurs in input-sparsity time.

13. The system of claim 9, wherein:
adaptively sampling $c_2=O(k/\epsilon)$ columns of A comprises derandomization; and
adaptively sampling $r_2=O(k/\epsilon)$ rows of A comprises derandomization.

14. The system of claim 13, wherein the construction of the matrices C, U, and R comprises a deterministic CUR decomposition.

15. A computer program product for reducing storage space occupied by a matrix A, the computer program product comprising a non-transitory computer readable storage medium having program instructions embodied therewith, the program instructions executable by one or more processors to cause the one or more processors to perform a method comprising:
constructing, by a first hardware circuit, a matrix C based on the matrix A, wherein the constructing the matrix C based on the matrix A comprises:
computing $Z_1$ as the top k singular vectors of A, wherein a scalar k is a target rank of a matrix U and is selected to be less than the rank of the matrix A, wherein $A_k$ is a rank-k approximation of the matrix A, wherein a scalar $\epsilon$ is between 0 and 1 and represents a selected accuracy parameter, and wherein $\|A-AZ_1Z_1^T\|_F^2 \leq (1+\epsilon)\|A-A_k\|_F^2$;
sampling $O(k \log k)$ columns from the transpose of $Z_1$, wherein the sampling uses leverage scores;
down-sampling the sampled columns to $C_1$ comprising $c_1=O(k)$ columns, wherein $\|A-C_1C_1^\dagger\|_F^2 \leq O(1)\|A-AZ_1Z_1^T\|_F^2$; and
adaptively sampling $c_2=O(k/\epsilon)$ columns of A, wherein $$\|A - C \cdot D\|_F^2 \leq \|A - A_k\|_F^2 + \left(\frac{k}{c_2}\right)\|A - C_1 C_1^\dagger A\|_F^2,$$

wherein D is selected to be a rank-k matrix;
constructing, by a second hardware circuit distinct from the first hardware circuit, a matrix R based on the matrix A and the matrix C; and
constructing, by a third hardware circuit distinct from the first hardware circuit and the second hardware circuit, the matrix U based on the matrices A, C, and R;
wherein the matrices C, U, and R comprise a CUR decomposition of the matrix A; and
reducing storage space occupied by the matrix A by replacing the matrix A with the matrices C, U, and R.

16. The computer program product of claim 15, wherein the constructing the matrix R based on the matrix A and the matrix C comprises:

$$\|A - AZ_1Z_1^T\|_F^2 \leq (1+\epsilon)\|A-A_k\|_F^2 \|A\ C_1C_1^\dagger\|_F^2 \leq$$
$$O(1)\|A\ AZ_1Z_1^T\|_F^2 \|A - C \cdot D\|_F^2 \leq \|A-A_k\|_F^2 + \left(\frac{k}{c_2}\right)\|A - C_1C_1^\dagger A\|_F^2;$$

and finding $Z_2$ in the span of the matrix C, wherein $\|A-AZ_2Z_2^T\|_F^2 < (1+\epsilon)\|A-A_k\|_F^2$;
sampling $O(k \log k)$ rows of $Z_2$, wherein the sampling uses leverage scores;
down-sampling the sampled rows to $R_1$ comprising $r_1=O(k)$ columns using BSS sampling, wherein $\|A R_1R_1^\dagger\|_F^2 \leq O(1)\|A\ AZ_2Z_2^T A\|_F^2$; and
adaptively sampling $r_2=O(k/\epsilon)$ rows of A, wherein $$\|A - Z_2Z_2^T A R^\dagger R\|_F^2 \leq \|A - Z_2Z_2^T A\|_F^2 + \text{rank}\left(\frac{Z_1Z_2^T A}{r_2}\right)\|A - AR_1R_1^\dagger\|_F^2.$$

17. The computer program product of claim 16, wherein:
down-sampling the sampled columns to $C_1$ comprising $c_1=O(k)$ columns using BSS sampling uses an input-sparsity-time BSS sampling algorithm;
adaptively sampling $c_2=O(k/\epsilon)$ columns of A occurs in input-sparsity time;
down-sampling the sampled rows to $R_1$ comprising $r_1=O(k)$ columns using BSS sampling uses the input-sparsity-time BSS sampling algorithm;
adaptively sampling $r_2=O(k/\epsilon)$ rows of A occurs in input-sparsity time; and
constructing the matrix U based on the matrices A, C, and R is performed in input-sparsity time.

18. The computer program product of claim 17, wherein the construction of the matrices C, U, and R occurs in input-sparsity time.

19. The computer program product of claim 16, wherein:
adaptively sampling $c_2=O(k/\epsilon)$ columns of A comprises derandomization; and
adaptively sampling $r_2=O(k/\epsilon)$ rows of A comprises derandomization.

20. The computer program product of claim 19, wherein the construction of the matrices C, U, and R comprises a deterministic CUR decomposition.

* * * * *

UNITED STATES PATENT AND TRADEMARK OFFICE
CERTIFICATE OF CORRECTION

PATENT NO. : 9,760,537 B2
APPLICATION NO. : 14/525917
DATED : September 12, 2017
INVENTOR(S) : Christos Boutsidis and David P. Woodruff Page 1 of 1

It is certified that error appears in the above-identified patent and that said Letters Patent is hereby corrected as shown below:

In the Specification

Insert the following statement in Column 1, Line 3:

-- STATEMENT REGARDING FEDERALLY SPONSORED RESEARCH OR DEVELOPMENT
This invention was made with Government support under Contract FA8750-12-C-0323 awarded by the Air Force. The Government has certain rights in this invention. --

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*